(12) United States Patent
Park

(10) Patent No.: US 12,402,331 B2
(45) Date of Patent: Aug. 26, 2025

(54) DECOUPLING CAPACITORS BASED ON DUMMY THROUGH-SILICON-VIA PLATES

(71) Applicant: Intel Corporation, Santa Clara, CA (US)

(72) Inventor: Changyok Park, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 828 days.

(21) Appl. No.: 17/170,951

(22) Filed: Feb. 9, 2021

(65) Prior Publication Data

US 2022/0254872 A1 Aug. 11, 2022

(51) Int. Cl.
| | |
|---|---|
| *H10D 1/00* | (2025.01) |
| *H01G 4/012* | (2006.01) |
| *H01G 4/30* | (2006.01) |
| *H01G 4/38* | (2006.01) |
| *H01L 21/768* | (2006.01) |
| *H01L 23/48* | (2006.01) |
| *H10D 1/68* | (2025.01) |

(52) U.S. Cl.
CPC .............. *H10D 1/042* (2025.01); *H01G 4/012* (2013.01); *H01G 4/30* (2013.01); *H01G 4/38* (2013.01); *H01L 21/76898* (2013.01); *H01L 23/481* (2013.01); *H10D 1/716* (2025.01)

(58) Field of Classification Search
CPC ......... H01L 28/90–92; H01L 29/66181; H01L 29/945; H01L 21/76898; H01G 4/012; H01G 4/30–302; H01G 4/38
See application file for complete search history.

(56) References Cited

U.S. PATENT DOCUMENTS

| | | | | |
|---|---|---|---|---|
| 5,290,729 A | * | 3/1994 | Hayashide | ............... H01L 28/82 257/E21.018 |
| 9,385,039 B2 | | 7/2016 | Sakuma | |

(Continued)

OTHER PUBLICATIONS

Extended European Search Report in European Patent Application No. EP22150099 dated Jun. 2, 2022. 11 pages.

(Continued)

*Primary Examiner* — Christine S. Kim
*Assistant Examiner* — Tyler J Wiegand
(74) *Attorney, Agent, or Firm* — Akona IP PC

(57) ABSTRACT

Disclosed herein are IC structures with decoupling capacitors based on dummy TSV plates provided in a support structure (e.g., a substrate, a die, a wafer, or a chip). An example decoupling capacitor includes first and second capacitor plates and a capacitor insulator between them. Each capacitor plate is a different blind, plate-like opening in the support structure, the openings at least partially filled with one or more conductive materials. The capacitor plate openings are referred to herein as "dummy TSV plates" because they may be fabricated while providing regular TSV openings in the support structure. Such decoupling capacitors may be better suited for high-speed microprocessor applications than conventional off-chip decoupling capacitors and may advantageously allow integrating on-chip decoupling capacitors with an ample amount of capacitive decoupling, limited or no additional processing steps on top of regular TSV processing, and in areas that may not have been used otherwise.

21 Claims, 15 Drawing Sheets

(56) References Cited

U.S. PATENT DOCUMENTS

| | | |
|---|---|---|
| 9,536,784 B1 | 1/2017 | Farooq et al. |
| 9,847,255 B2 | 12/2017 | Lin et al. |
| 10,181,454 B2 | 1/2019 | Park |
| 2010/0052099 A1* | 3/2010 | Chang .................. H01L 23/642 |
| | | 257/E29.342 |
| 2012/0168902 A1 | 7/2012 | Zhu et al. |
| 2015/0028450 A1 | 1/2015 | Park et al. |
| 2015/0102395 A1 | 4/2015 | Park et al. |
| 2017/0110420 A1* | 4/2017 | Cheng .................. H01L 21/6835 |
| 2018/0158897 A1* | 6/2018 | Gong ...................... H01L 28/87 |
| 2020/0381420 A1* | 12/2020 | Chen ............... H01L 21/823481 |
| 2021/0296283 A1* | 9/2021 | Huang .................. H01L 23/481 |
| 2022/0028825 A1* | 1/2022 | Jeng ........................ H01L 25/50 |

OTHER PUBLICATIONS

Wolf, Stanley, Chapter 16 : Copper Interconnect Process Technology : Silicon Processing for the VLSI Era, vol. 4: Deep-Submicron Process Technology, pp. 711-793, Jan. 2022.

* cited by examiner

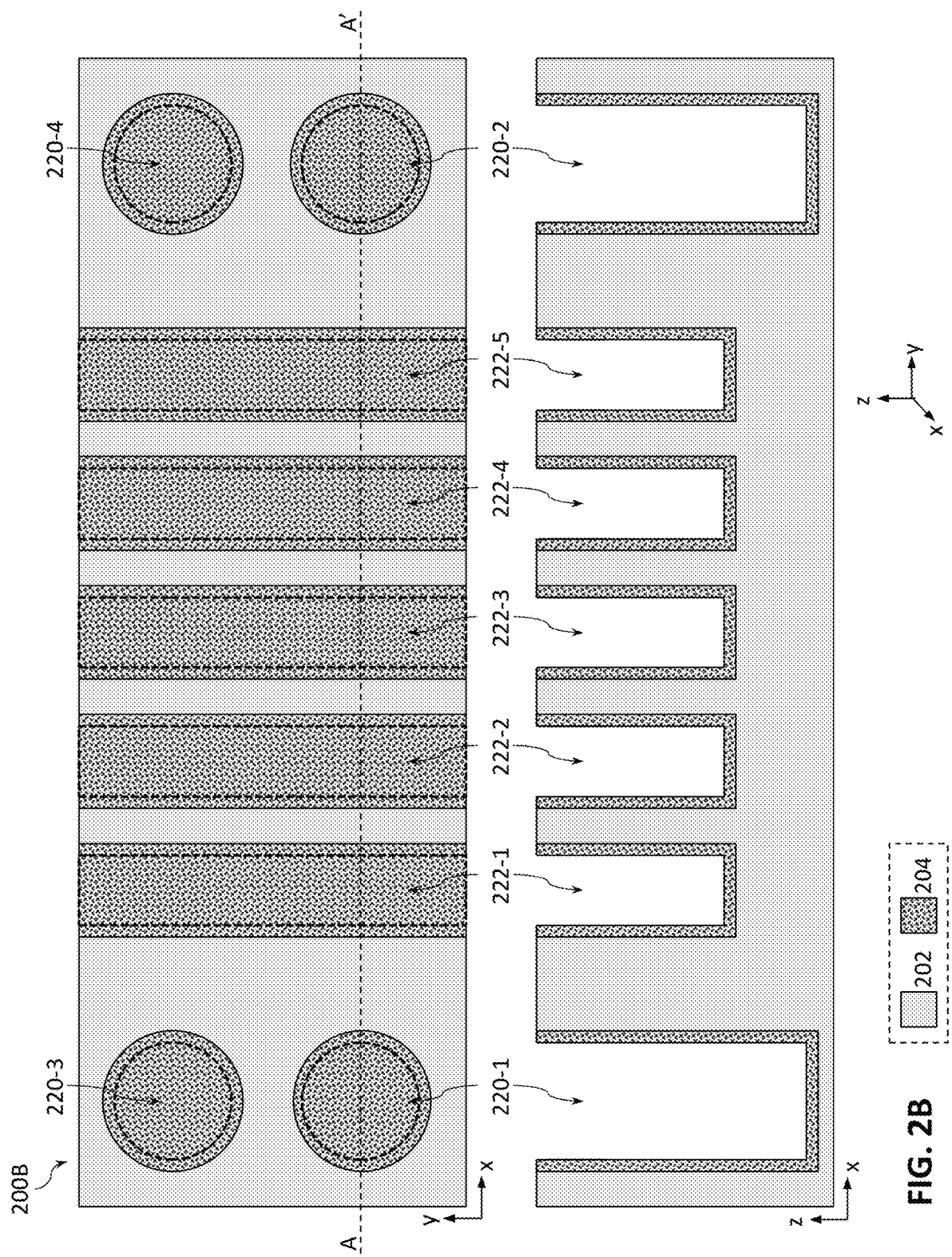

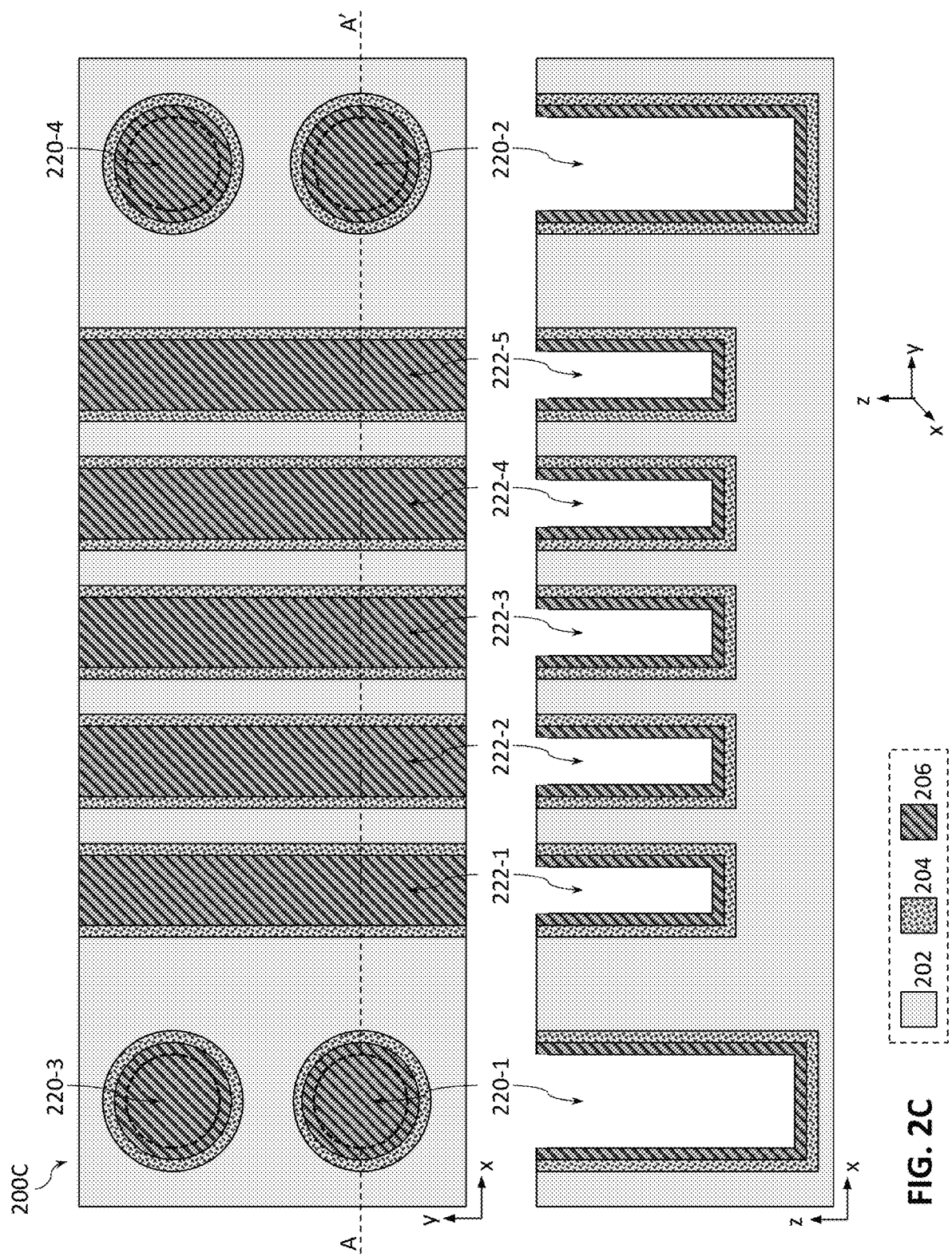

DECOUPLING CAPACITORS BASED ON DUMMY THROUGH-SILICON-VIA PLATES

TECHNICAL FIELD

This disclosure relates generally to the field of integrated circuit (IC) structures and devices, and more specifically, to decoupling capacitors monolithically integrated in such IC structures and devices.

BACKGROUND

A decoupling capacitor is a capacitor used to decouple one part of an electrical network from another. Noise caused by other circuit elements can be shunted through the decoupling capacitor, reducing the effect it has on the rest of the circuit.

Decoupling capacitors are typically included in semiconductor packages in order to lower the inductance through the package by reducing the lead length. Decoupling capacitors placed close to power consuming circuits are able to smooth out voltage variation with charges stored on them. The stored charge either dissipates or is used as a local power supply to device inputs during signal switching stages, allowing the decoupling capacitors to negate the effects of voltage noise induced into the system by parasitic inductance.

Conventional off-chip decoupling capacitors may not be suitable for very high-speed microprocessor applications. Since off-chip decoupling capacitors are located at a relatively long distance from the switching circuits, the time delay caused by the long inductance path makes such capacitors unusable with gigahertz switching circuits.

In order to sustain high frequency circuit operation, an ample amount of capacitive decoupling must be provided close to the switching circuits. Although it is possible to integrate chip capacitors within the chip's circuit elements, the capacitors compete for valuable die area that could be used for building additional circuits. Due to the limited area in which to build these capacitors, the overall capacitive decoupling that they provide is also limited.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 2A-2J illustrate various stages in the manufacture of an example IC structure according to the method of FIG. 1, in accordance with some embodiments.

DETAILED DESCRIPTION

Overview

Figure 1:
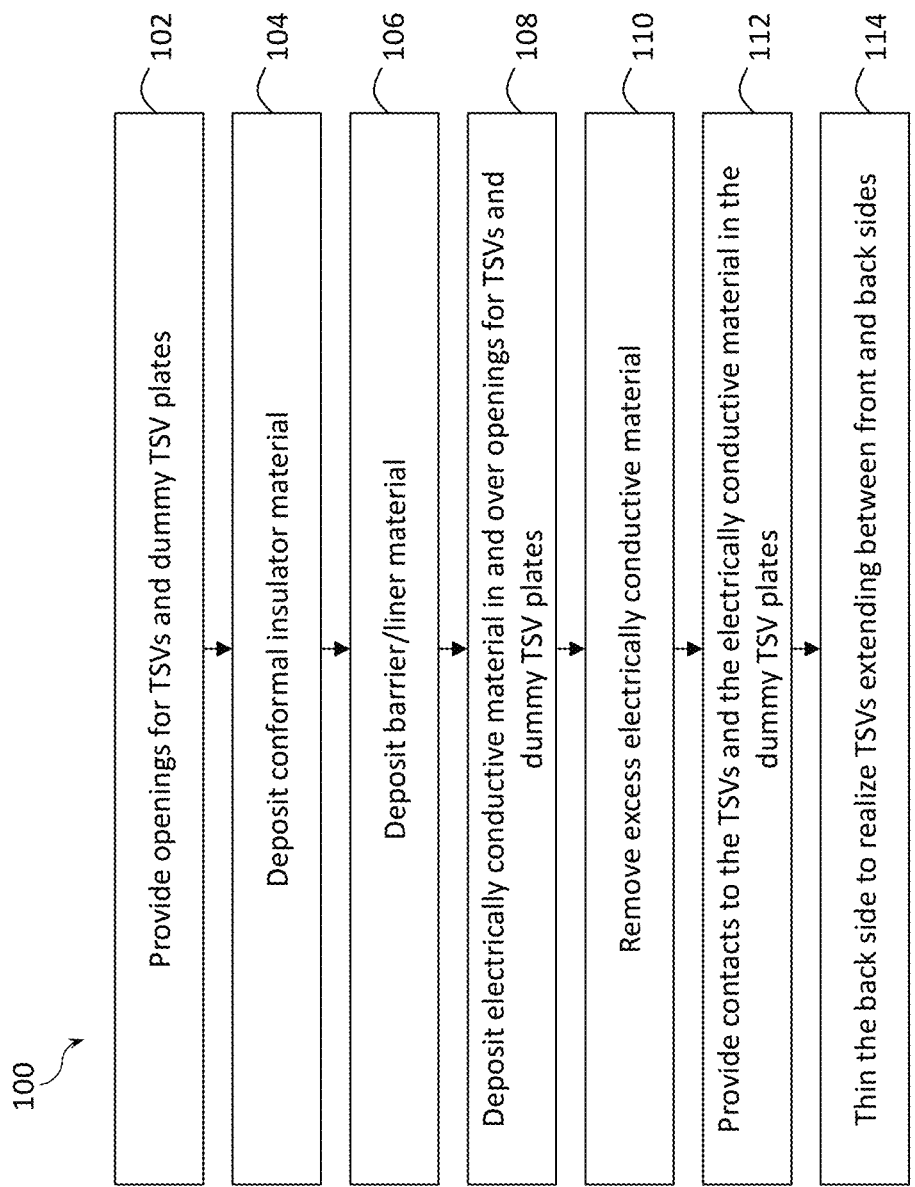
FIG. 1 is a flow diagram of an example method for fabricating decoupling capacitors based on dummy through-silicon-via (TSV) plates, in accordance with some embodiments.

The systems, methods and devices of this disclosure each have several innovative aspects, no single one of which is solely responsible for all desirable attributes disclosed herein. Details of one or more implementations of the subject matter described in this specification are set forth in the description below and the accompanying drawings.

For purposes of illustrating decoupling capacitors based on dummy TSV plates, described herein, it might be useful to first understand phenomena that may come into play during IC fabrication. The following foundational information may be viewed as a basis from which the present disclosure may be properly explained. Such information is offered for purposes of explanation only and, accordingly, should not be construed in any way to limit the broad scope of the present disclosure and its potential applications.

ICs commonly include electrically conductive microelectronic structures, which are known in the arts as vias, to electrically connect metal lines or other interconnects above the vias to metal lines or other interconnects below the vias. In this context, the term "metallization stack" may be used to describe a stacked series of electrically insulated metallic interconnecting wires that are used to connect together various devices of an IC, where adjacent layers of the stack are linked together through the use of electrical contacts and vias.

Vias are typically formed by a lithographic process. Representatively, a photoresist layer may be spin coated over a dielectric layer, the photoresist layer may be exposed to patterned actinic radiation through a patterned mask or reflected from a patterned mask (e.g., in the case of EUV), and then the exposed layer may be developed in order to form an opening in the photoresist layer, which may be referred to as a via location opening. Next, an opening for the via may be etched in the dielectric layer by using the location opening in the photoresist layer as an etch mask. This opening in the dielectric layer is referred to as a via opening. Finally, the via opening may be filled with one or more metals or other conductive materials to form the via.

TSVs are a particular type of vias that extend through a support structure (e.g., through a substrate, wafer, or a chip). Such regular TSVs are typically used for provision of power and/or signals of various components of IC structures/devices.

Disclosed herein are IC structures (e.g., IC devices) with one or more decoupling capacitors based on dummy TSV plates provided in a support structure (e.g., a substrate, a die, a wafer, or a chip) of an IC structure. An example decoupling capacitor includes first and second capacitor plates and a capacitor insulator between them. Each capacitor plate is a different blind opening in the support structure, the openings at least partially filled with one or more electrically conductive materials. The capacitor plate openings are plate-like openings in that each capacitor plate opening has a width, a length, and a depth such that the width is at least about 2 times smaller than each of the length and the depth. Thus, as used herein, an opening is described as a "plate-like" if the width of the opening (e.g., a dimension measured along the x-axis of the x-y-z coordinate system shown in the present drawings) is smaller than each of the length of the opening (e.g., a dimension measured along the y-axis of the x-y-z coordinate system shown in the present drawings) and the depth of the opening (e.g., a dimension measured along the z-axis of the x-y-z coordinate system shown in the present drawings), e.g., at least about 2 times smaller, e.g., at least about 4 times smaller or at least about 6 times smaller. In various embodiments, the length of the opening may be either comparable than the depth of the opening or may be larger or smaller than the depth of the opening. Because such plate-like openings may be fabricated substantially simultaneously with providing TSV openings in the support structure, while not being used for the same purposes as the TSVs but rather being used as basis for forming capacitor plates of one or more decoupling capacitors monolithically integrated in the support structure, they are referred to herein as "dummy TSV plates." Such decoupling capacitors may, advantageously, be provided on the same support structures as (e.g., monolithically integrated with) the TSVs and various IC components, making these decoupling capacitors better suited for high-speed microprocessor applications compared to conventional off-chip decoupling capacitors. Furthermore, providing decoupling capacitors in the support structures of IC structures with capacitor plates being based on dummy TSV plates advantageously allows integrating on-chip decoupling capacitors with an ample amount of capacitive decoupling, limited amount of or no additional processing steps on top of regular TSV processing, in areas that may not have been used otherwise. Because the material of the support structure/substrate (e.g., silicon) may have a higher dielectric constant (e.g., silicon has a dielectric constant of around 12), it may advantageously help with more polarization to store more charge (i.e., higher capacitance of such decoupling capacitors), once electrical isolation is ensured with insulators.

IC structures as described herein, in particular IC structures with TSVs and with decoupling capacitors based on dummy TSV plates as described herein, may be used for providing electrical connectivity to one or more components associated with an IC or/and between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

For purposes of explanation, specific numbers, materials and configurations are set forth in order to provide a thorough understanding of the illustrative implementations. However, it will be apparent to one skilled in the art that the present disclosure may be practiced without the specific details or/and that the present disclosure may be practiced with only some of the described aspects. In other instances, well-known features are omitted or simplified in order not to obscure the illustrative implementations.

Further, references are made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, if a collection of drawings designated with different letters are present, e.g., FIGS. 2A-2J, such a collection may be referred to herein without the letters, e.g., as "FIG. 2."

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges.

The description uses the phrases "in an embodiment" or "in embodiments," which may each refer to one or more of the same or different embodiments. The terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

In the following detailed description, various aspects of the illustrative implementations will be described using terms commonly employed by those skilled in the art to convey the substance of their work to others skilled in the art. For example, as used herein, a "high-k dielectric" refers to a material having a higher dielectric constant than silicon oxide while a "low-k dielectric" refers to a material having a lower dielectric constant than silicon oxide. The terms "substantially," "close," "approximately," "near," and "about," generally refer to being within +/−20% of a target value based on the context of a particular value as described herein or as known in the art.

Fabricating IC Structures with Decoupling Capacitors Based on Dummy TSV Plates

Figure 2A:
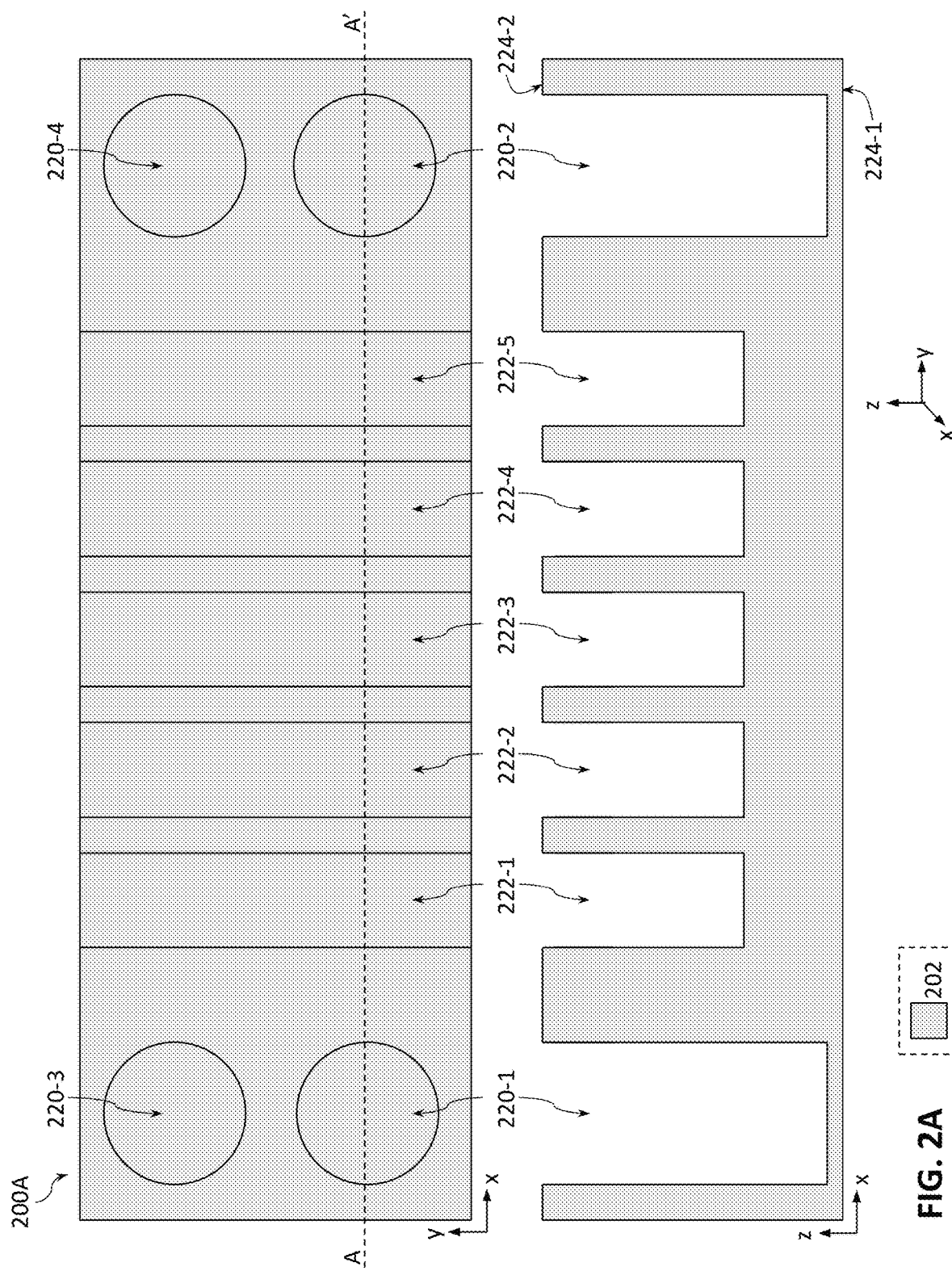
Figure 2D:
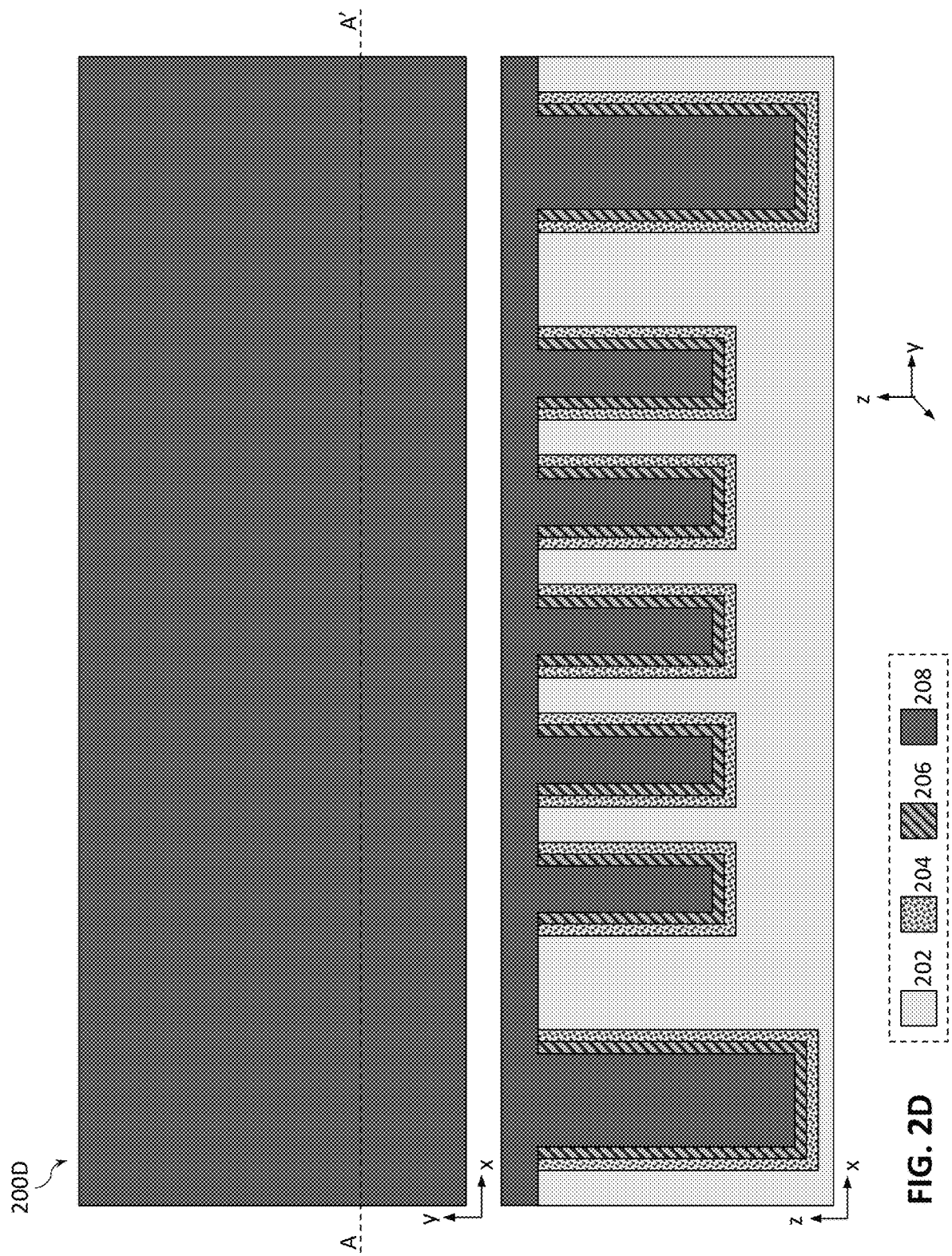

FIG. 1 is a flow diagram of an example method 100 for fabricating decoupling capacitors based on dummy TSV plates, in accordance with some embodiments. FIGS. 2A-2J illustrate top-down and cross-sectional side views for various stages in the manufacture of an example IC structure 200 (e.g., the IC structure 200A shown in FIG. 2A, 200B shown in FIG. 2B, and so on until 200J shown in FIG. 2J) according to the fabrication method 100, in accordance with some embodiments. In particular, each of FIGS. 2A-2E shows, at the top of the page of the drawing, a top-down view (i.e., a view in a x-y plane) of the IC structure 200 and, at the bottom of the page of the drawing, a cross-section side view of the IC structure 200 with the cross-section taken along an x-z plane AA' of the reference coordinate system x-y-z shown in FIGS. 2A-2E. FIG. 2F shows only the top-down view of the IC structure 200, FIGS. 2G and 2I show only the cross-section side views of the IC structure 200 with the cross-section taken along the x-z plane AA' indicated in the top-down view of FIG. 2F, while FIGS. 2H and 2J show only the cross-section side views of the IC structure 200 with the cross-section taken along the x-z plane BB' indicated in the top-down view of FIG. 2F.

A number of elements referred to in the description of FIGS. 2A-2J with reference numerals are illustrated in these figures with different patterns, with a legend showing the correspondence between the reference numerals and patterns being provided at the bottom of each drawing page containing FIGS. 2A-2J. For example, the legend illustrates that FIGS. 2A-2J use different patterns to show a support structure 202, a dielectric material 204, an electrically conductive material 208, etc. Furthermore, although a certain number of a given element may be illustrated in some of FIGS. 2A-2J (e.g., 4 TSVs and 5 dummy TSV plates in between), this is simply for ease of illustration, and more, or less, than that number may be included in an IC structure according to various embodiments of the present disclosure. Still further, various IC structure views shown in FIGS. 2A-2J are intended to show relative arrangements of various elements therein, and that various IC structures, or portions thereof, may include other elements or components that are not illustrated (e.g., transistor portions, various components that may be in electrical contact with any of the TSVs, etc.).

Turning to FIG. 1, the method 100 may begin with a process 102 that includes providing openings for one or more TSVs and one or more dummy TSV plates in a support structure. An IC structure 200A, depicted in FIG. 2A, illustrates an example result of the process 102. As shown in FIG. 2A, the IC structure 200A may include a support structure 202, openings 220-1 through 220-4 for TSVs, and openings 222-1 through 222-5 for dummy TSV plates. Although FIG. 2A and subsequent FIGS. 2B-2J illustrate an embodiment of the IC structure 200 with 4 TSV openings 220 and 5 dummy TSV plate openings 222, this is simply for ease of illustration, and more, or less, than that number may be included in the IC structure 200 according to various embodiments of the present disclosure, as long as at least two dummy TSV plate openings 222 (e.g., the dummy TSV plate openings 222-1 and 222-2) are provided to form first and second capacitor plates of a single decoupling capacitor (presence of the TSV openings 220 is optional).

In general, implementations of the disclosure may be formed or carried out on a substrate, such as a semiconductor substrate composed of semiconductor material systems including, for example, N-type or P-type materials systems. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V, group II-VI, or group IV materials. Although a few examples of materials from which the substrate may be formed are described here, any material that may serve as a foundation upon which an IC may be built falls within the spirit and scope of the present disclosure. In various embodiments, the support structure 202 may include any such substrate, possibly with some layers and/or devices already formed thereon, not specifically shown in the present figures, providing a suitable surface for forming the decoupling capacitors based on dummy TSV plates, as described therein.

Although not specifically shown in the present drawings, any suitable processes may be used in the process 102 to form the TSV openings 220 and the dummy TSV plate openings 222, e.g., any suitable lithographic process in combination with a suitable etching process. In various embodiments, suitable lithographic processes may include photolithography, electron-beam lithography, etc., which may be used to define locations and dimensions for the TSV openings 220 and the dummy TSV plate openings 222. In various embodiments, suitable etching processes may include dry etch, wet etch, etc., which may be used to remove portions of the support structure 202 in regions defined by the lithographic process to form the TSV openings 220 and the dummy TSV plate openings 222. For example, any suitable anisotropic etch process, e.g., a dry etch, may be used in the process 102 to etch the support structure 202 through the openings defined by the lithographic process (e.g., openings defined in a photoresist material, not shown in FIG. 2A) to form the TSV openings 220 and the dummy TSV plate openings 222. In some embodiments, during the etch of the support structure 202 in the process 102, the IC structure may be heated to elevated temperatures, e.g., to temperatures between about room temperature and 200 degrees Celsius, including all values and ranges therein, to promote that byproducts of the etch are made sufficiently volatile to be removed from the surface.

In some embodiments, the width (a dimension measured along the x-axis of the example coordinate system x-y-z shown in FIG. 2) of the TSV openings 220 may be between about 100 nanometers and 20 micrometers (in various embodiments, TSV opening sizes could hundreds of nanometers to tens of micrometers), including all values and ranges therein, e.g., between about 500 nanometers and 10 micrometers. In some embodiments, the width of the dummy TSV plate openings 222 may be smaller than the width of the TSV openings 220 (e.g., to use micro-loading effect and minimize additional process steps), e.g., the width of the dummy TSV plate openings 222 may be between about 250 and 5000 nanometers, including all values and ranges therein, e.g., between about 100 and 2500 nanometers. In some embodiments, the width of the TSV openings 220 may be between about 1.5 and 10 times greater than the width of the dummy TSV plate openings 222, including all values and ranges therein, e.g., between about 2 and 5 times greater. Because the width of the TSV openings 220 is larger than that of the dummy TSV plate openings 222, the TSV openings 220 may be etched further/deeper into the support structure 202 than the dummy TSV plate openings 222. In some embodiments, the depth (a dimension measured along the z-axis of the example coordinate system shown in FIG. 2) of the TSV openings 220 may be between about 1.1 and 4 times greater than the depth of the dummy TSV plate openings 222, including all values and ranges therein, e.g., between about 1.5 and 2 times greater. In some embodiments, the depth of the TSV openings 220 may be between about 1.1 and 4 times smaller than the thickness of the support structure 202 (i.e., a distance between a first side 224-1 and a second side 224-2 of the support structure 202, a dimension measured along the z-axis of the example coordinate system shown in FIG. 2). In some embodiments, the depth of the TSV openings 220 may be between about 500 nanometers and 50 micrometers (it could be hundreds of nanometers to tens of micrometers, for regular TSVs it could be few to tens of micrometers, e.g., 2 to 50 micrometers), including all values and ranges therein, e.g., between about 1 micrometer and 30 micrometers, or between about 1 and 25 micrometers. In some embodiments, the depth of the dummy TSV plate openings 222 may be between about 250 nanometers and 25 micrometers, including all values and ranges therein, e.g., between about 500 nanometers and 15 micrometers.

The dummy TSV plate openings 222 are plate-like openings in that, for each of the dummy TSV plate openings 222, the width may be at least 2 times smaller than each of the length and the depth, including all values and ranges therein, e.g., at least 3 times smaller or at least 5 times smaller. The length (a dimension measured along the y-axis of the example coordinate system shown in FIG. 2) of the dummy TSV plate openings 222 may be comparable to the depth of these openings, or, in some embodiments, may be smaller than the depth of these openings. In some embodiments, the pitch of the dummy TSV plate openings 222 (i.e., center-to-center distance of adjacent openings 222) may be between about 1.01 times and 2 times of the width of the dummy TSV plate openings 222, including all values and ranges therein, e.g., between about 1.1 and 1.5 times of the width of the dummy TSV plate openings 222. In some embodiments, a distance between the closest sidewalls of one of the TSV openings 220 and one of the dummy TSV plate openings 222 may be between about 100 nanometers and tens of micrometers, including all values and ranges therein, e.g., between about 500 nanometers and 50 micrometers.

The method 100 may then proceed with a process 104 that includes conformally depositing a layer/liner of an insulator material into the openings formed in the process 102. A result of this is illustrated with an IC structure 200B, depicted in FIG. 2B, showing a layer of an insulator material 204 deposited into the openings 220 and 222 formed in the process 102. In some embodiments of the process 104, a liner of the insulator material 204 may be deposited over sidewalls and bottoms of the TSV openings 220 and over sidewalls and bottoms of the dummy TSV plate openings 222 using any suitable techniques for conformally depositing materials onto selected surfaces, such as atomic layer deposition (ALD), chemical vapor deposition (CVD), plasma enhanced CVD (PECVD), or/and physical vapor deposition (PVD) processes such as sputter. In some embodiments, the insulator material 204 may include any suitable material for acting as an insulation barrier for the electrically conductive material that will later fill the TSV openings 220 and the dummy TSV plate openings 222. Examples of such materials include, but are not limited to, silicon dioxide and silicon nitride. In some embodiments, the insulator material 204 may include any suitable material for acting as a capacitor insulator for future decoupling capacitors. Examples of such materials include, but are not limited to, dielectric materials known for their applicability in ICs, such as low-k dielectric materials. Examples of dielectric materials that may be used as the insulator material 204 may include, but are not limited to, silicon dioxide ($SiO_2$), carbon-doped oxide (CDO), silicon nitride, fluorosilicate glass (FSG), silicon nitride, and organosilicates such as silsesquioxane, siloxane, or organosilicate glass. In some embodiments, the insulator material 204 may include organic polymers such as polyimide, polynorbornenes, benzocyclobutene, perfluorocyclobutane, or polytetrafluoroethylene (PTFE). Still other examples of low-k dielectric materials that may be used as the insulator material 204 include silicon-based polymeric dielectrics such as hydrogen silsesquioxane (HSQ) and methylsilsesquioxane (MSQ). In some embodiments, a thickness of the insulator material 204 on the sidewalls and bottoms of the TSV openings 220 may be between about 1 and 7 nanometers, including all values and ranges therein, e.g., between about 2 and 5 nanometers.

The method 100 may then proceed with a process 106 that includes conformally depositing a layer/liner of a barrier material into the openings formed in the process 102. A result of this is illustrated with an IC structure 200C, depicted in FIG. 2C, showing a layer of a barrier material 206 deposited into the openings 220 and 222 formed in the process 102. In particular, FIG. 2C illustrates the embodiments where the barrier material 206 is deposited into the openings 220 and 222 that were first lined with the insulator material 204. However, in other embodiments of the IC structure 200, either the insulator material 204 or the barrier material 206 may be absent (i.e., in other embodiments of the method 100, either the process 104 or the process 106 may be absent). In some embodiments of the process 106, a liner of the barrier material 206 may be deposited over sidewalls and bottoms of the TSV openings 220 and over sidewalls and bottoms of the dummy TSV plate openings 222 using any suitable techniques for conformally depositing materials onto selected surfaces, such as ALD, CVD, PECVD, or/and PVD. In some embodiments, the barrier material 206 may include any suitable material for acting as a diffusion barrier for the electrically conductive material that will later fill the TSV openings 220 and the dummy TSV plate openings 222. Examples of such materials include, but are not limited to, electrically conductive materials such as tantalum (Ta), tantalum nitride (TaN), titanium (Ti), titanium nitride (TiN), ruthenium (Ru), and cobalt (Co). In some embodiments, the liner of the barrier material 206 may help provide electrical conductivity, and, therefore, choice of materials used for the barrier material 206 may reflect that. For example, the barrier material 206 may include materials having a wide range of resistivities, such as in the range of 0.1 $\mu\Omega\cdot cm$ to 400 $\mu\Omega\cdot cm$, including all values and ranges therein. More specifically than resistivity, in some implementations, choice of materials for the barrier material 206 may be made so that the resistance of the electrical connection satisfies appropriate requirements of the particular electrical circuit being implemented. Therefore, in some embodiments, high resistivity material(s) may still be used at an appropriately low thickness such that the net resistance satisfies circuit requirements. In some embodiments, a thickness of the barrier material 206 on the sidewalls and bottoms of the TSV openings 220 may be between about 5 and hundreds of nanometers, including all values and ranges therein, e.g., between about 10 and 200 nanometers.

The method 100 may then continue with a process 108 that includes filling the TSV openings 220 and the dummy TSV plate openings 222 with an electrically conductive material. A result of this is illustrated with an IC structure 200D, depicted in FIG. 2D, showing an electrically conductive material 208 provided within the TSV openings 220 and the dummy TSV plate openings 222, as well as over the upper surface of the IC structure 200D. The electrically conductive material 208 may be deposited in the process 108 using a deposition technique such as, but not limited to, ALD, CVD, PECVD, PVD, or electroplating. The electrically conductive material 208 deposited in the process 108 may include one or more of any suitable electrically conductive materials (conductors). Such materials may include any suitable electrically conductive material, alloy, or a stack of multiple electrically conductive materials. In some embodiments, the electrically conductive material 208 may include one or more metals or metal alloys, with metals such as copper, ruthenium, palladium, platinum, cobalt, nickel, hafnium, zirconium, titanium, tantalum, and aluminum. In some embodiments, the electrically conductive material 208 may include one or more electrically conductive alloys, oxides (e.g., conductive metal oxides), carbides (e.g., hafnium carbide, zirconium carbide, titanium carbide, tantalum carbide, and aluminum carbide, tungsten, tungsten carbide), or nitrides (e.g., hafnium nitride, zirconium nitride, titanium nitride, tantalum nitride, and aluminum nitride) of one or more metals.

Next, the method 100 may include a process 110 that include removing the excess of the electrically conductive material 208 deposited in the process 108 over the upper surface of the IC structure (including over the TSV openings 220 and over the dummy TSV plate openings 222) to expose the top (e.g., the second side 224-2) of the support structure 202. A result of this is illustrated with an IC structure 200E, depicted in FIG. 2E. A process of removing excess materials is typically referred to as "planarization." In various embodiments, planarization of the process 110 may be performed using either wet or dry planarization processes. In one embodiment, planarization of the process 110 may be performed using chemical mechanical planarization (CMP), which may be understood as a process that utilizes a polishing surface, an abrasive and a slurry to remove the overburden of the electrically conductive material 208 and planarize the surface of the IC structure 200D to expose the upper surface of the support structure 202 and the upper surface of the electrically conductive material 208 within the TSV openings 220 and within the dummy TSV plate openings 222. Although FIG. 2E and subsequent drawings illustrate that the TSV openings 220 and the dummy TSV plate openings 222 are fully filled with the electrically conductive material 208, in other embodiments of the IC structure 200 the fill may be only partial in any of the TSV openings 220 and the dummy TSV plate openings 222 (e.g., the electrically conductive material 208 may only line the sidewalls and bottoms of any of the TSV openings 220 and the dummy TSV plate openings 222).

Figure 2E:
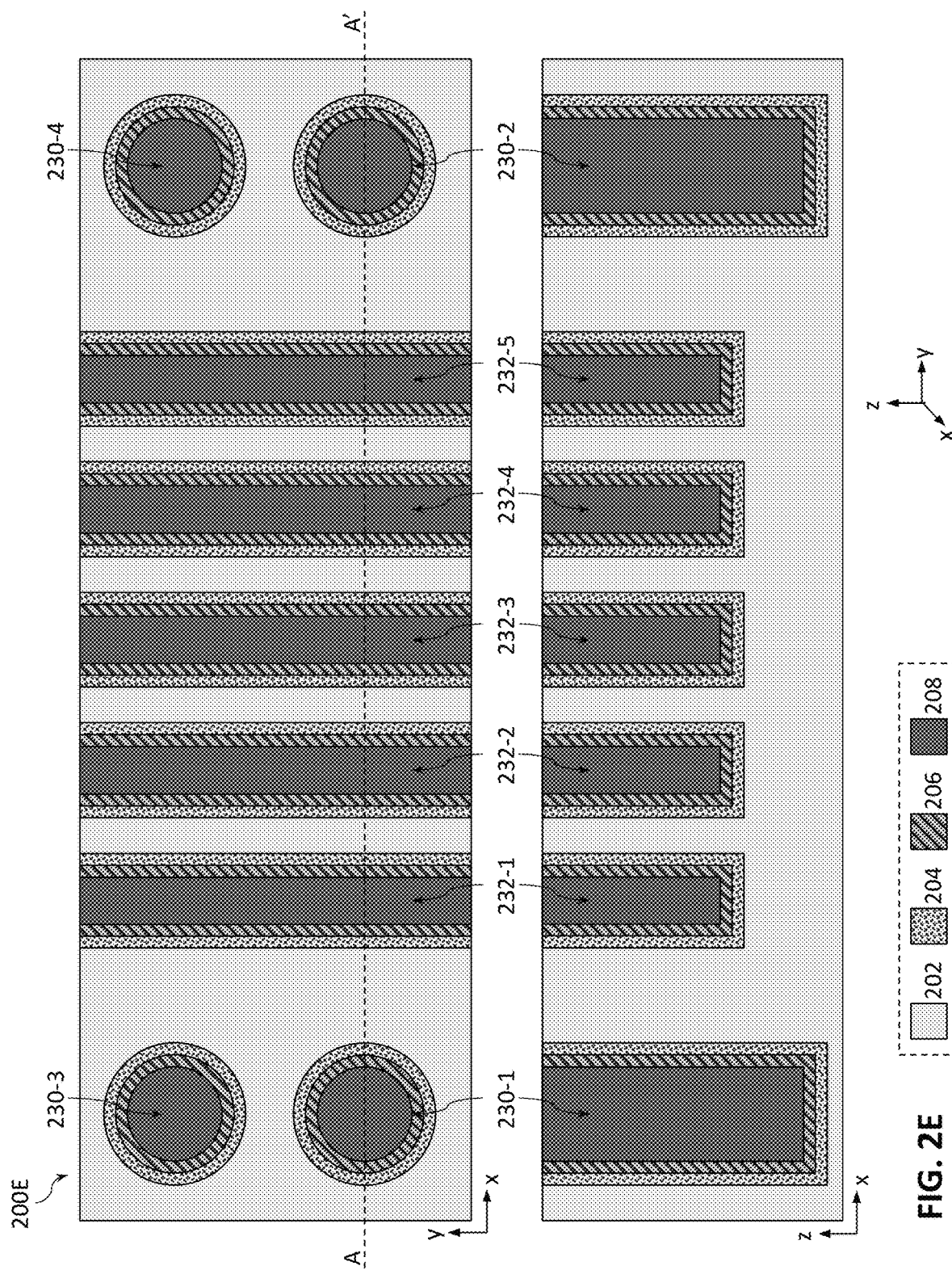
Figure 2F:
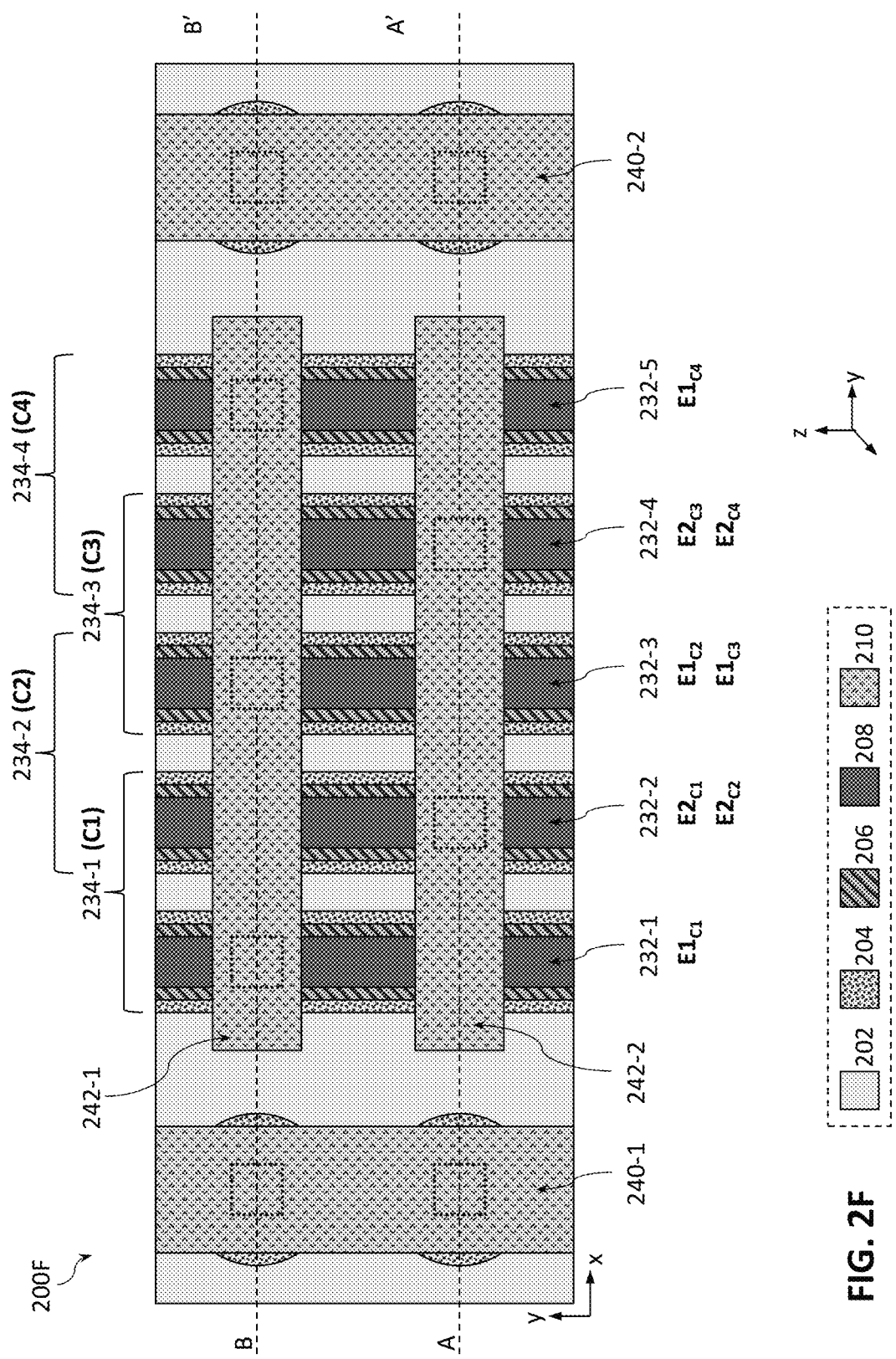
Figure 2G:
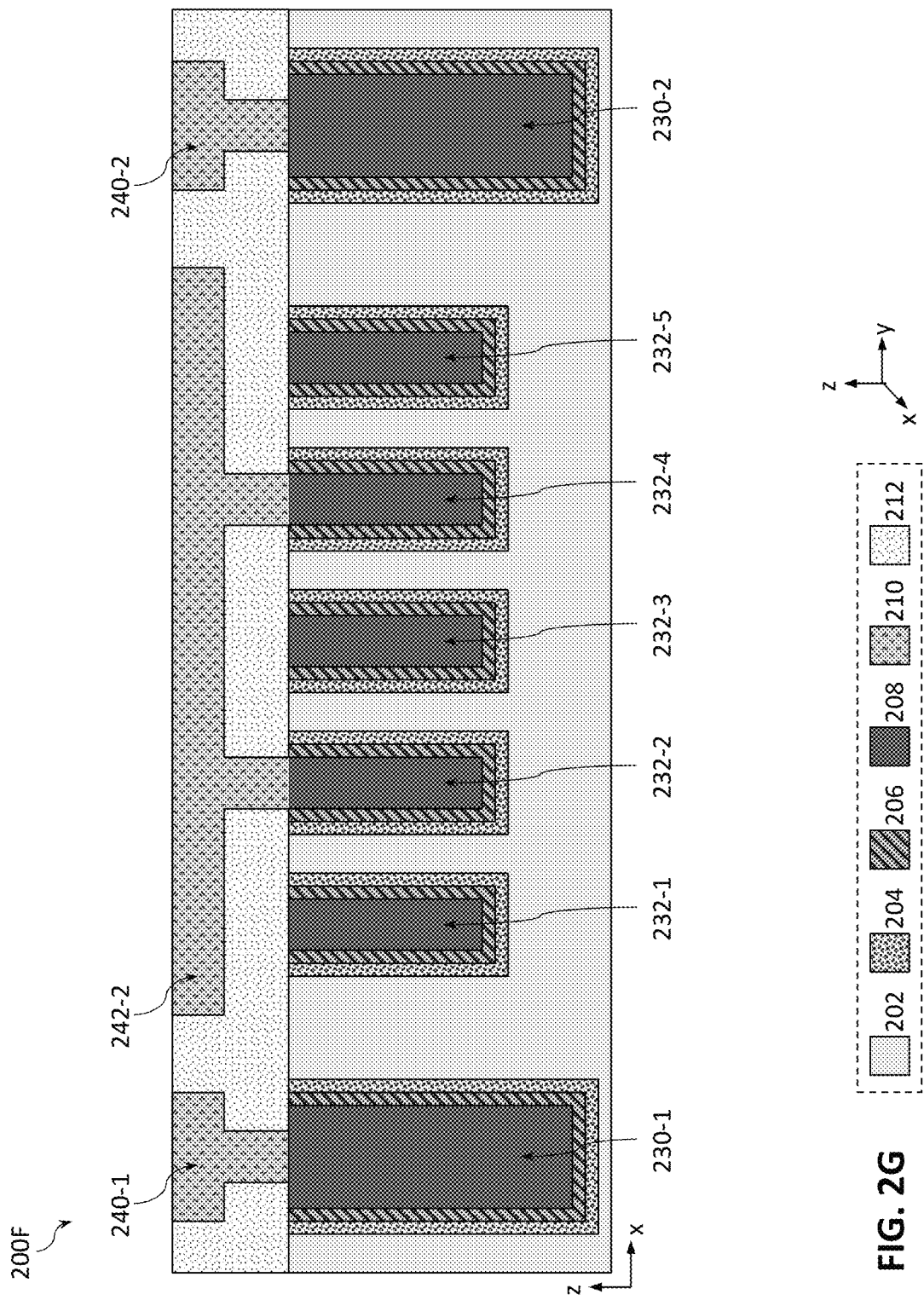
Figure 2H:
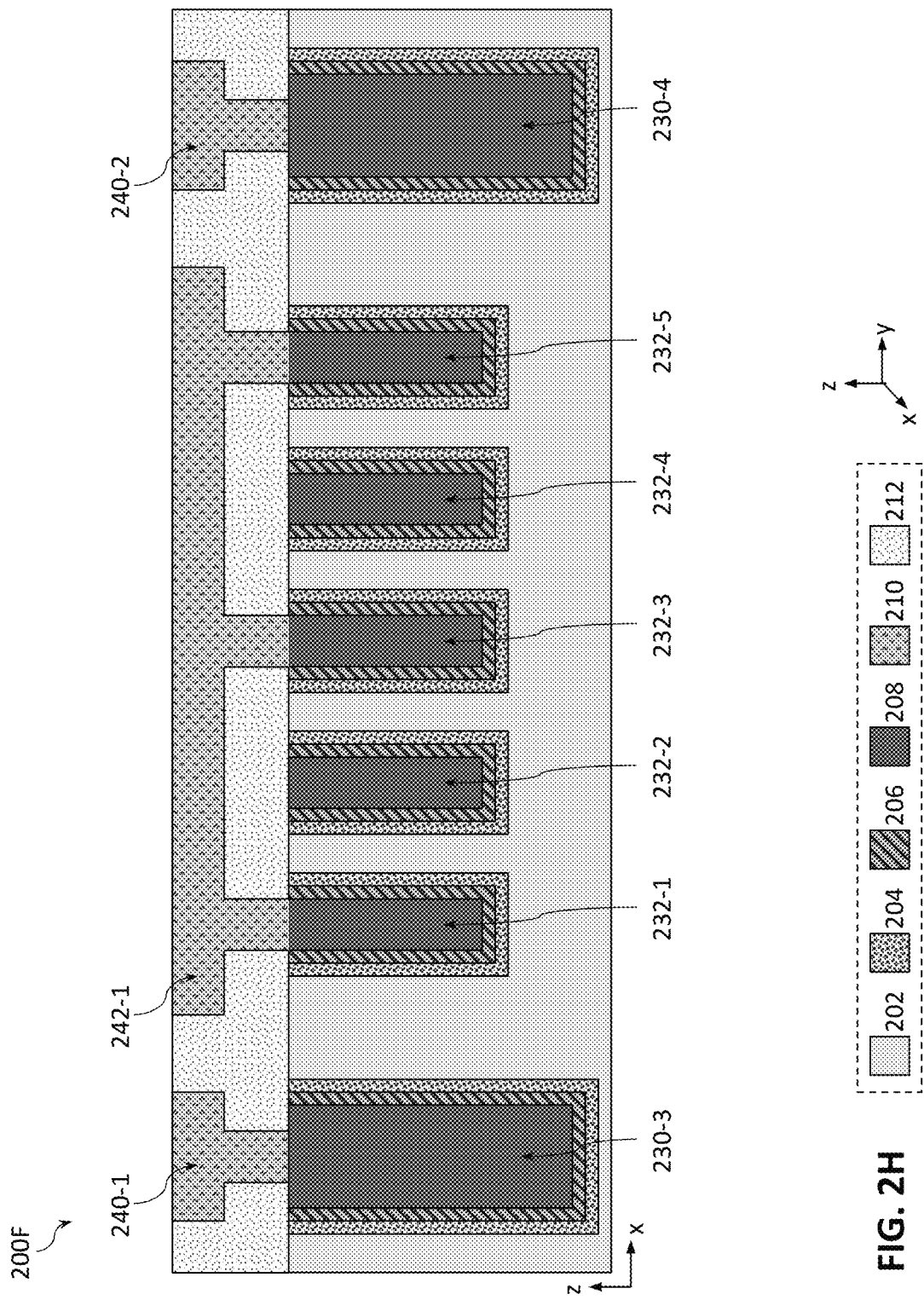
Figure 2I:
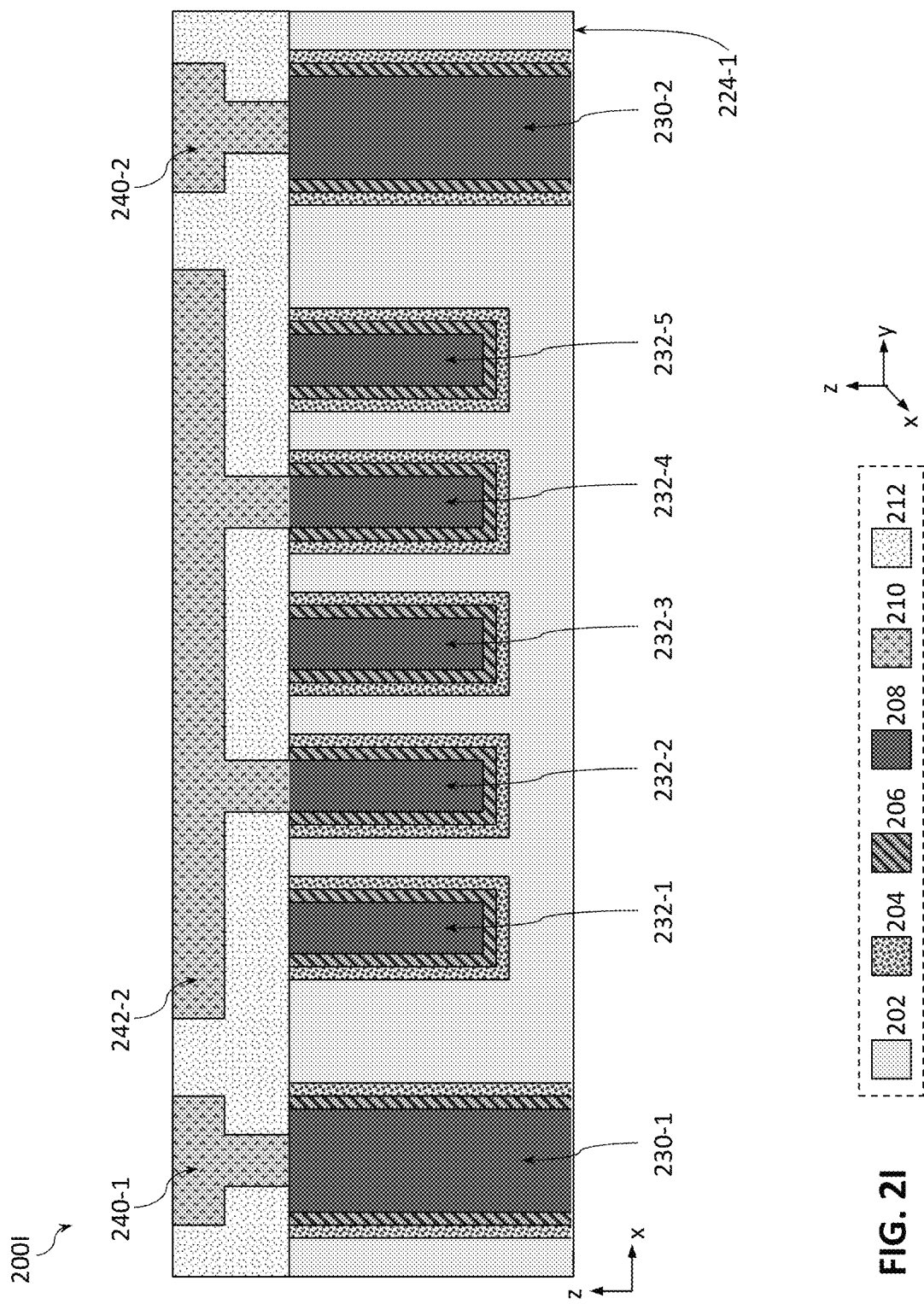
Figure 2J:
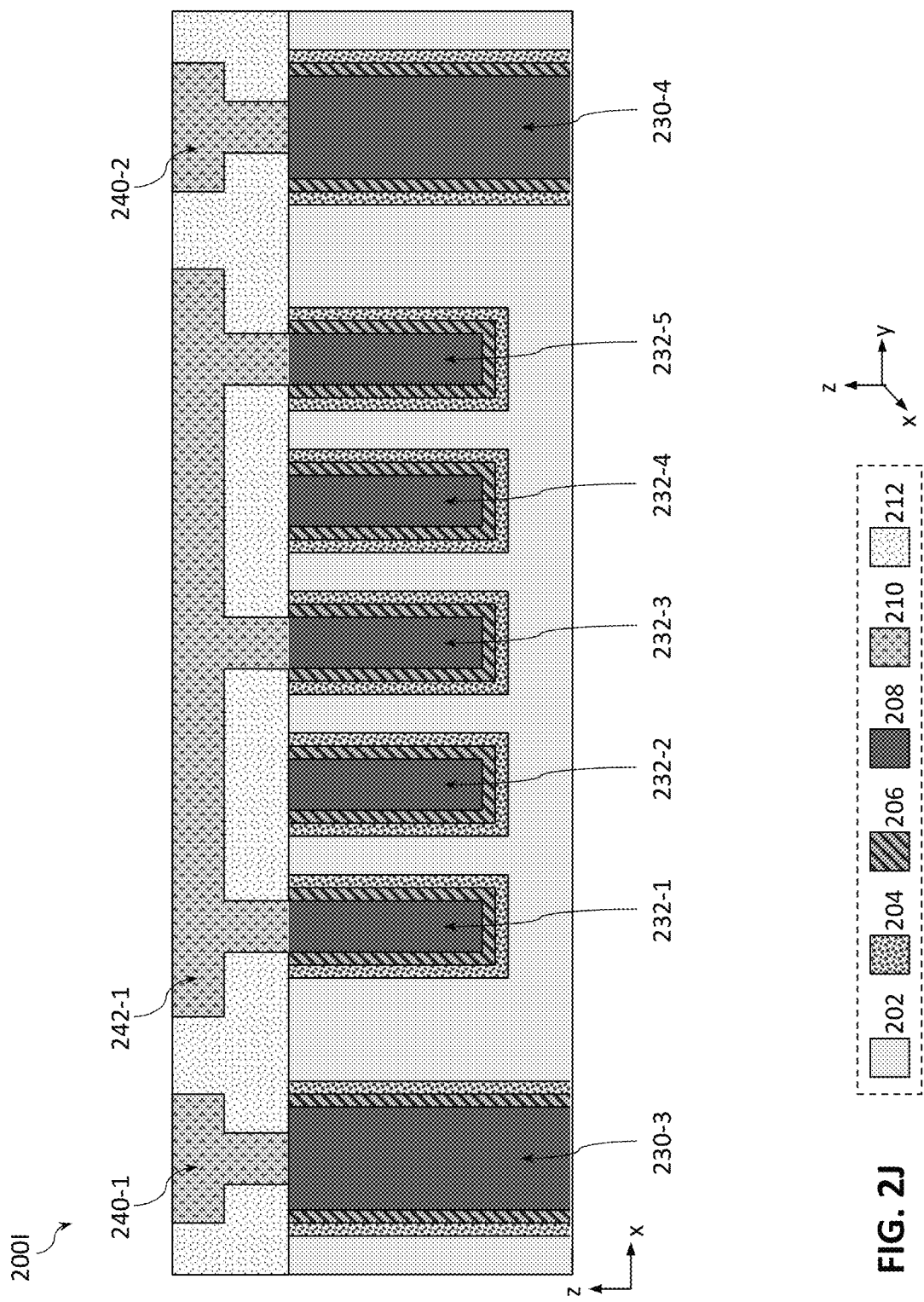

The TSV openings 220 at least partially filled with the electrically conductive material 208 form TSVs 230 (labeled in FIG. 2E as TSVs 230-1 through 230-4, corresponding to the TSV openings 220-1 through 220-4). Similarly, the dummy TSV plate openings 222 at least partially filled with the electrically conductive material 208 form dummy TSV plates 232 (labeled in FIG. 2E as dummy TSV plates 232-1 through 232-5, corresponding to the dummy TSV plate openings 222-1 through 222-5).

Adjacent dummy TSV plates 232 may form first and second capacitor electrodes (in this case—capacitor plates) of decoupling capacitors of the IC structure 200. To that end, the method 100 may also include a process 112 that includes providing contacts (i.e., electrical connections/interconnects) to the first and second capacitor plates of the decoupling capacitors formed by the dummy TSV plates 232. A result of this is illustrated with an IC structure 200F, depicted in FIGS. 2F-2H, showing decoupling capacitors 234-1 (C1) through 234-4 (C4), and further showing TSV interconnects 240-1 and 240-2 for providing electrical connectivity to the electrically conductive material 208 of the TSVs 230, and decoupling capacitor interconnects 242-1 and 242-2 for providing electrical connectivity to, respectively, first and second capacitor plates of the decoupling capacitors 234.

First and second capacitor electrodes of the decoupling capacitors 234, formed by the adjacent dummy TSV plates 232, are labeled in the IC structure 200F as, respectively, capacitor electrodes $E1_{C_x}$ and $E2_{C_x}$, where "E" stands for "electrode" (i.e., a capacitor electrode/plate) and "x" may be an integer indicating a given decoupling capacitor (e.g., x may be 1, 2, 3, or 4 to indicate one of the capacitors C1 through C4). For example, as labeled in the IC structure 200F, the dummy TSV plates 232-1 and 232-2 may form, respectively, first and second capacitor electrodes $E1_{C_1}$ and $E2_{C_1}$ of the first decoupling capacitor 234-1, the dummy TSV plates 232-3 and 232-2 may form, respectively, first and second capacitor electrodes $E1_{C_2}$ and $E2_{C_2}$ of the second decoupling capacitor 234-2, the dummy TSV plates 232-3 and 232-4 may form, respectively, first and second capacitor electrodes $E1_{C_3}$ and $E2_{C_3}$ of the third decoupling capacitor 234-3, and the dummy TSV plates 232-5 and 232-4 may form, respectively, first and second capacitor electrodes $E1_{C_4}$ and $E2_{C_4}$ of the fourth decoupling capacitor 234-4. Thus, when multiple decoupling capacitors 234 are implemented, some of the dummy TSV plates 232 may serve as capacitor electrodes of different decoupling capacitors. For example, in the IC structure 200F, each of the dummy TSV plates 232-2, 232-3, and 232-4 may be shared as a capacitor electrode of different decoupling capacitors 234. For various decoupling capacitors 234, capacitor insulator (i.e., an electrically insulating material that separates first and second capacitor electrodes of a capacitor) may be a portion of the support structure 202 between the first and second capacitor electrodes and/or the insulator material 204 provided within the dummy TSV plate openings 222.

In some embodiments, the first capacitor electrodes $E1_{C_x}$ of various decoupling capacitors 234 may be coupled to the first decoupling capacitor interconnect 242-1, while the second capacitor electrodes $E2_{C_x}$ of various decoupling capacitors 234 may be coupled to the second decoupling capacitor interconnect 242-2, which may be electrically isolated from the first decoupling capacitor interconnect 242-1. In some such embodiments, the first and second capacitor electrodes of multiple decoupling capacitors 234 may be provided in an alternating manner, as illustrated in the example of the IC structure 200F. In some embodiments, the first capacitor electrodes $E1_{C_x}$ of various decoupling capacitors 234 may be coupled to a positive supply voltage (e.g., VDD), e.g., via the first decoupling capacitor interconnect 242-1, while the second capacitor electrodes $E2_{C_x}$ of various decoupling capacitors 234 may be coupled to a negative supply voltage or a ground potential (e.g., VSS), e.g., via the second decoupling capacitor interconnect 242-2. In other embodiments, this may be reversed, i.e., the first capacitor electrodes $E1_{Cx}$ of various decoupling capacitors 234 may be coupled to a negative supply voltage (e.g., VSS), e.g., via the first decoupling capacitor interconnect 242-1, while the second capacitor electrodes $E2_{Cx}$ of various decoupling capacitors 234 may be coupled to a positive supply voltage or a ground potential (e.g., VDD), e.g., via the second decoupling capacitor interconnect 242-2. In some embodiments, the first TSV interconnect 240-1 may be coupled to the electrically conductive material 208 of the TSVs 230-1 and 230-3, while the second TSV interconnect 240-2 may be coupled to the electrically conductive material 208 of the TSVs 230-2 and 230-4. In other embodiments, the number and the locations of any of the interconnects 240 and 242 may be different from what is shown in FIGS. 2F-2H.

The interconnects 240 and 242 may be formed of a contact material 210, which may include any suitable electrically conductive material, such as any of the electrically conductive materials described above with reference to the electrically conductive material 208, and may be provided within a layer of a dielectric material 212, which may include any of the dielectric/interlayer dielectric (ILD) materials described above. The dielectric material 212 is not shown in the top-down view of FIG. 2F in order to not obscure the decoupling capacitors 234.

The method 100 may conclude with a process 114 that includes thinning the back side of the support structure 202 to realize TSVs that extend between front and back sides of the support structure 202. A result of this is illustrated with an IC structure 2001, depicted in FIGS. 2I-2J, showing that the back side 224-1 of the support structure 202 may be thinned until the electrically conductive material 208 of the TSVs 230 is exposed (i.e., is at the surface of the back side 224-1) so that an electrical connection may be made to the TSVs 230. The top-down view of the IC structure 2001 is not shown specifically because, in some embodiments, it may be substantially the same as the top-down view of the IC structure 200F, shown in FIG. 2F.

Example Devices

The IC structures with decoupling capacitors based on dummy TSV plates disclosed herein may be included in any suitable electronic device. FIGS. 3-6 illustrate various examples of apparatuses that may include one or more of the IC structures disclosed herein.

Figure 3B:
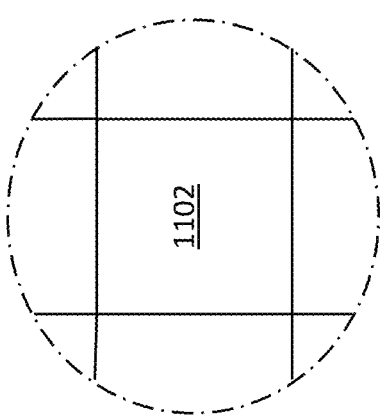
FIGS. 3A and 3B are top views of a wafer and dies that include one or more IC structures with decoupling capacitors based on dummy TSV plates in accordance with any of the embodiments disclosed herein.
Figure 3A:
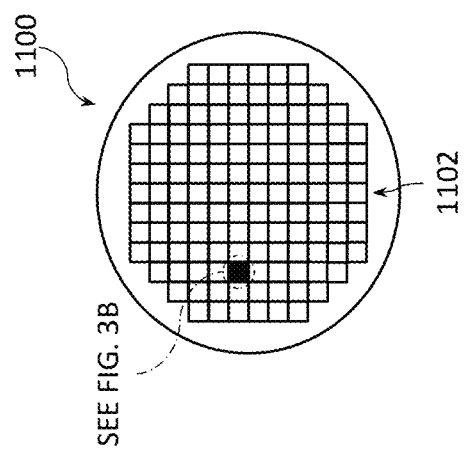

FIGS. 3A and 3B are top views of a wafer and dies that include one or more IC structures with one or more decoupling capacitors based on dummy TSV plates in accordance with any of the embodiments disclosed herein. The wafer 1100 may be composed of semiconductor material and may include one or more dies 1102 having IC structures formed on a surface of the wafer 1100. Each of the dies 1102 may be a repeating unit of a semiconductor product that includes any suitable IC structure (e.g., the IC structure 200 as shown in any of FIGS. 2F-2I, or any further embodiments of the IC structure 200). After the fabrication of the semiconductor product is complete (e.g., after manufacture of one or more IC structures with one or more decoupling capacitors based on dummy TSV plates as described herein, included in a particular electronic component, e.g., in a transistor or in a memory device), the wafer 1100 may undergo a singulation process in which each of the dies 1102 is separated from one another to provide discrete "chips" of the semiconductor product. In particular, devices that include one or more IC structures with one or more decoupling capacitors based on dummy TSV plates as disclosed herein may take the form of the wafer 1100 (e.g., not singulated) or the form of the die 1102 (e.g., singulated). The die 1102 may include one or more transistors (e.g., one or more of the transistors 1240 of FIG. 4, discussed below) and/or supporting circuitry to route electrical signals to the transistors, as well as any other IC components (e.g., one or more IC structures with one or more decoupling capacitors based on dummy TSV plates as discussed herein). In some embodiments, the wafer 1100 or the die 1102 may include a memory device (e.g., a static random-access memory (SRAM) device), a logic device (e.g., an AND, OR, NAND, or NOR gate), or any other suitable circuit element. Multiple ones of these devices may be combined on a single die 1102. For example, a memory array formed by multiple memory devices may be formed on a same die 1102 as a processing device (e.g., the processing device 1402 of FIG. 6) or other logic that is configured to store information in the memory devices or execute instructions stored in the memory array.

Figure 4:
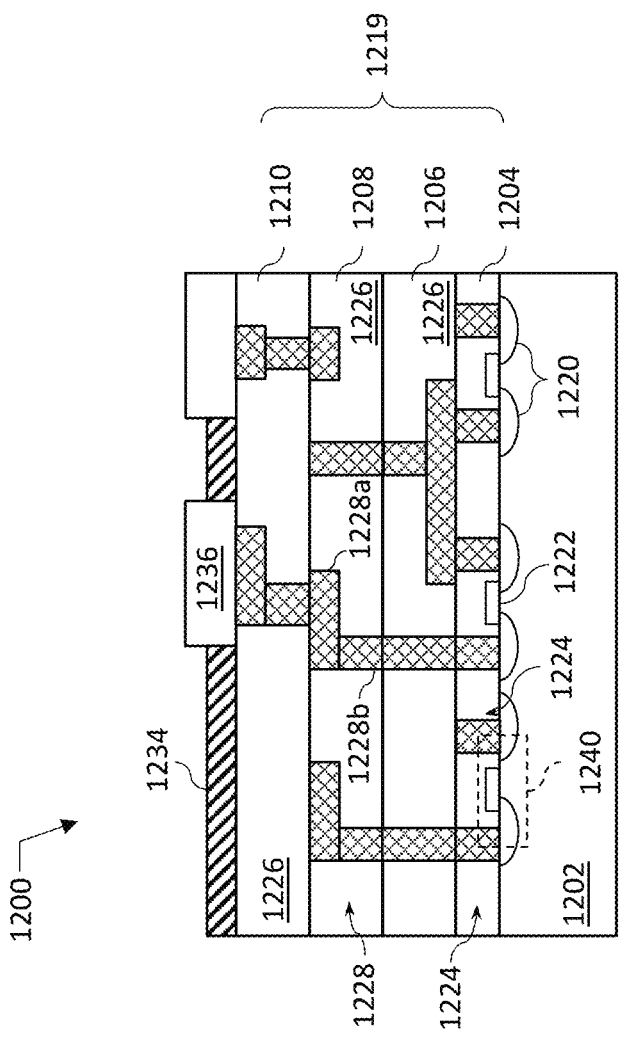
FIG. 4 is a cross-sectional side view of an IC device that may include one or more IC structures with decoupling capacitors based on dummy TSV plates in accordance with any of the embodiments disclosed herein.

FIG. 4 is a cross-sectional side view of an IC device 1200 that may include one or more IC structures with one or more decoupling capacitors based on dummy TSV plates in accordance with any of the embodiments disclosed herein. The IC device 1200 may be formed on a substrate 1202 (e.g., the wafer 1100 of FIG. 3A) and may be included in a die (e.g., the die 1102 of FIG. 3B). The substrate 1202 may be any substrate as described herein. The substrate 1202 may be part of a singulated die (e.g., the dies 1102 of FIG. 3B) or a wafer (e.g., the wafer 1100 of FIG. 3A).

The IC device 1200 may include one or more device layers 1204 disposed on the substrate 1202. The device layer 1204 may include features of one or more transistors 1240 (e.g., metal oxide semiconductor field-effect transistors (MOSFETs)) formed on the substrate 1202. The device layer 1204 may include, for example, one or more source and/or drain (S/D) regions 1220, a gate 1222 to control current flow in the transistors 1240 between the S/D regions 1220, and one or more S/D contacts 1224 to route electrical signals to/from the S/D regions 1220. The transistors 1240 may include additional features not depicted for the sake of clarity, such as device isolation regions, gate contacts, and the like. The transistors 1240 are not limited to the type and configuration depicted in FIG. 4 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 1240 may include a gate 1222 formed of at least two layers, a gate electrode layer and a gate dielectric layer.

The gate electrode layer may be formed on the gate interconnect support layer and may consist of at least one P-type workfunction metal or N-type workfunction metal, depending on whether the transistor is to be a PMOS or an NMOS transistor, respectively. In some implementations, the gate electrode layer may consist of a stack of two or more metal layers, where one or more metal layers are workfunction metal layers and at least one metal layer is a fill metal layer. Further metal layers may be included for other purposes, such as a barrier layer or/and an adhesion layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 electron Volts (eV) and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, aluminum carbide, tungsten, tungsten carbide. An N-type metal layer will enable the formation of an NMOS gate electrode with a workfunction that is between about 3.9 eV and about 4.2 eV.

In some embodiments, when viewed as a cross-section of the transistor 1240 along the source-channel-drain direction, the gate electrode may be formed as a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may be implemented as a combination of U-shaped structures and planar, non-U-shaped structures. For example, the gate electrode may be implemented as one or more U-shaped metal layers formed atop one or more planar, non-U-shaped layers. In some embodiments, the gate electrode may consist of a V-shaped structure (e.g., when a fin of a FinFET transistor does not have a "flat" upper surface, but instead has a rounded peak).

Generally, the gate dielectric layer of a transistor 1240 may include one layer or a stack of layers, and the one or more layers may include silicon oxide, silicon dioxide, and/or a high-k dielectric material. The high-k dielectric material included in the gate dielectric layer of the transistor 1240 may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

Although not specifically shown in FIG. 4, the IC device 1200 may include one or more decoupling capacitors based on dummy TSV plates at any suitable location in the IC device 1200.

The S/D regions 1220 may be formed within the substrate 1202 adjacent to the gate 1222 of each transistor 1240, using any suitable processes known in the art. For example, the S/D regions 1220 may be formed using either an implantation/diffusion process or a deposition process. In the former process, dopants such as boron, aluminum, antimony, phosphorous, or arsenic may be ion-implanted into the substrate 1202 to form the S/D regions 1220. An annealing process that activates the dopants and causes them to diffuse farther into the substrate 1202 may follow the ion implantation process. In the latter process, an epitaxial deposition process may provide material that is used to fabricate the S/D regions 1220. In some implementations, the S/D regions 1220 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1220 may be formed using one or more alternate semiconductor materials such as germanium or a group III-V material or alloy. In further embodiments, one or more layers of metal and/or metal alloys may be used to form the S/D regions 1220. In some embodiments, an etch process may be performed before the epitaxial deposition to create recesses in the substrate 1202 in which the material for the S/D regions 1220 is deposited.

Electrical signals, such as power and/or input/output (I/O) signals, may be routed to and/or from the transistors 1240 of the device layer 1204 through one or more interconnect layers disposed on the device layer 1204 (illustrated in FIG. 4 as interconnect layers 1206-1210). For example, electrically conductive features of the device layer 1204 (e.g., the gate 1222 and the S/D contacts 1224) may be electrically coupled with the interconnect structures 1228 of the interconnect layers 1206-1210. The one or more interconnect layers 1206-1410 may form an ILD stack 1219 of the IC device 1200.

The interconnect structures 1228 may be arranged within the interconnect layers 1206-1210 to route electrical signals according to a wide variety of designs (in particular, the arrangement is not limited to the particular configuration of interconnect structures 1228 depicted in FIG. 4). Although a particular number of interconnect layers 1206-1210 is depicted in FIG. 4, embodiments of the present disclosure include IC devices having more or fewer interconnect layers than depicted.

In some embodiments, the interconnect structures 1228 may include trench contact structures 1228a (sometimes referred to as "lines") and/or via structures 1228b (sometimes referred to as "holes") filled with an electrically conductive material such as a metal. The trench contact structures 1228a may be arranged to route electrical signals in a direction of a plane that is substantially parallel with a surface of the substrate 1202 upon which the device layer 1204 is formed. For example, the trench contact structures 1228a may route electrical signals in a direction in and out of the page from the perspective of FIG. 4. The via structures 1228b may be arranged to route electrical signals in a direction of a plane that is substantially perpendicular to the surface of the substrate 1202 upon which the device layer 1204 is formed. In some embodiments, the via structures 1228b may electrically couple trench contact structures 1228a of different interconnect layers 1206-1210 together.

The interconnect layers 1206-1210 may include a dielectric material 1226 disposed between the interconnect structures 1228, as shown in FIG. 4. The dielectric material 1226 may take the form of any of the embodiments of the dielectric material provided between the interconnects of the IC structures disclosed herein, for example any of the embodiments discussed herein with reference to the dielectric material 204 or 212, described herein.

In some embodiments, the dielectric material 1226 disposed between the interconnect structures 1228 in different ones of the interconnect layers 1206-1210 may have different compositions. In other embodiments, the composition of the dielectric material 1226 between different interconnect layers 1206-1210 may be the same.

A first interconnect layer 1206 (referred to as Metal 1 or "M1") may be formed directly on the device layer 1204. In some embodiments, the first interconnect layer 1206 may include trench contact structures 1228a and/or via structures 1228b, as shown. The trench contact structures 1228a of the first interconnect layer 1206 may be coupled with contacts (e.g., the S/D contacts 1224) of the device layer 1204.

A second interconnect layer 1208 (referred to as Metal 2 or "M2") may be formed directly on the first interconnect layer 1206. In some embodiments, the second interconnect layer 1208 may include via structures 1228b to couple the trench contact structures 1228a of the second interconnect layer 1208 with the trench contact structures 1228a of the first interconnect layer 1206. Although the trench contact structures 1228a and the via structures 1228b are structurally delineated with a line within each interconnect layer (e.g., within the second interconnect layer 1208) for the sake of clarity, the trench contact structures 1228a and the via structures 1228b may be structurally and/or materially contiguous (e.g., simultaneously filled during a dual-damascene process) in some embodiments.

A third interconnect layer 1210 (referred to as Metal 3 or "M3") (and additional interconnect layers, as desired) may be formed in succession on the second interconnect layer 1208 according to similar techniques and configurations described in connection with the second interconnect layer 1208 or the first interconnect layer 1206.

The IC device 1200 may include a solder resist material 1234 (e.g., polyimide or similar material) and one or more bond pads 1236 formed on the interconnect layers 1206-1210. The bond pads 1236 may be electrically coupled with the interconnect structures 1228 and configured to route the electrical signals of the transistor(s) 1240 to other external devices. For example, solder bonds may be formed on the one or more bond pads 1236 to mechanically and/or electrically couple a chip including the IC device 1200 with another component (e.g., a circuit board). The IC device 1200 may have other alternative configurations to route the electrical signals from the interconnect layers 1206-1210 than depicted in other embodiments. For example, the bond pads 1236 may be replaced by or may further include other analogous features (e.g., posts) that route the electrical signals to external components.

Figure 5:
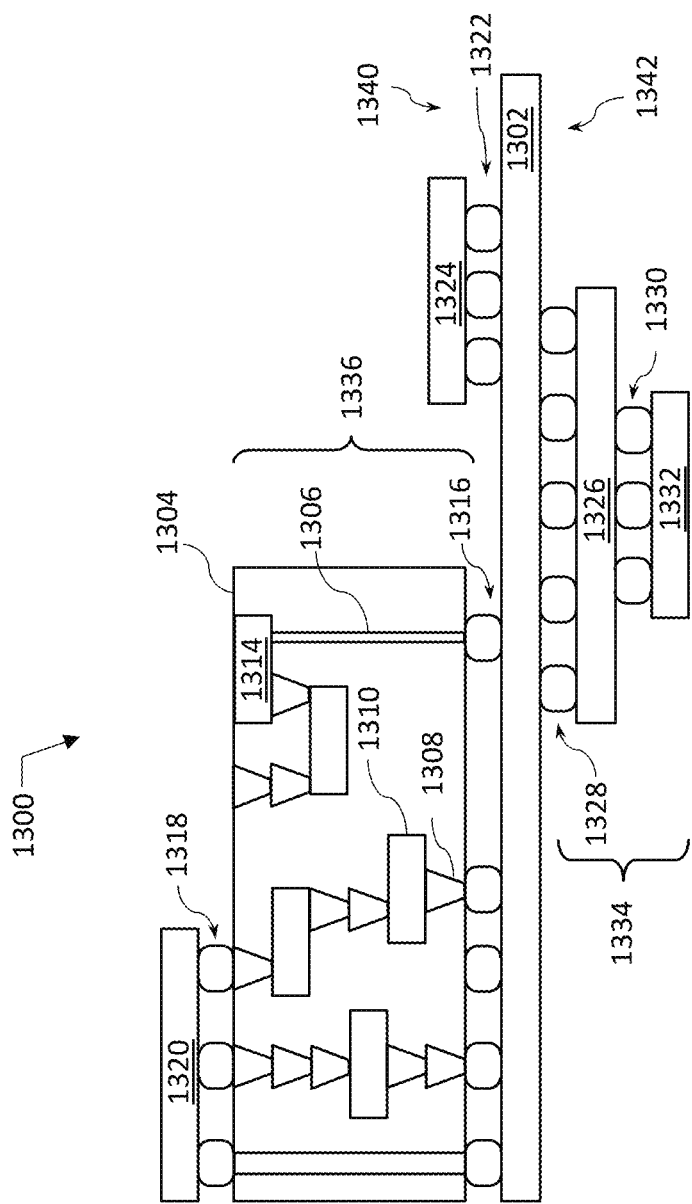
FIG. 5 is a cross-sectional side view of an IC device assembly that may include one or more IC structures with decoupling capacitors based on dummy TSV plates in accordance with any of the embodiments disclosed herein.

FIG. 5 is a cross-sectional side view of an IC device assembly 1300 that may include components having or being associated with (e.g., being electrically connected by means of) one or more IC structures with decoupling capacitors based on dummy TSV plates in accordance with any of the embodiments disclosed herein. The IC device assembly 1300 includes a number of components disposed on a circuit board 1302 (which may be, e.g., a motherboard). The IC device assembly 1300 includes components disposed on a first face 1340 of the circuit board 1302 and an opposing second face 1342 of the circuit board 1302; generally, components may be disposed on one or both faces 1340 and 1342. In particular, any suitable ones of the components of the IC device assembly 1300 may include any of the decoupling capacitors based on dummy TSV plates, disclosed herein.

In some embodiments, the circuit board 1302 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1302. In other embodiments, the circuit board 1302 may be a non-PCB substrate.

The IC device assembly 1300 illustrated in FIG. 5 includes a package-on-interposer structure 1336 coupled to the first face 1340 of the circuit board 1302 by coupling components 1316. The coupling components 1316 may electrically and mechanically couple the package-on-interposer structure 1336 to the circuit board 1302 and may include solder balls (as shown in FIG. 5), male and female portions of a socket, an adhesive, an underfill material, and/or any other suitable electrical and/or mechanical coupling structure.

The package-on-interposer structure 1336 may include an IC package 1320 coupled to an interposer 1304 by coupling components 1318. The coupling components 1318 may take any suitable form for the application, such as the forms discussed above with reference to the coupling components 1316. Although a single IC package 1320 is shown in FIG. 5, multiple IC packages may be coupled to the interposer 1304; indeed, additional interposers may be coupled to the interposer 1304. The interposer 1304 may provide an intervening substrate used to bridge the circuit board 1302 and the IC package 1320. The IC package 1320 may be or include, for example, a die (the die 1102 of FIG. 3B), an IC device (e.g., the IC device 1200 of FIG. 4), or any other suitable component. In some embodiments, the IC package 1320 may include one or more decoupling capacitors based on dummy TSV plates, as described herein. Generally, the interposer 1304 may spread a connection to a wider pitch or reroute a connection to a different connection. For example, the interposer 1304 may couple the IC package 1320 (e.g., a die) to a ball grid array (BGA) of the coupling components 1316 for coupling to the circuit board 1302. In the embodiment illustrated in FIG. 5, the IC package 1320 and the circuit board 1302 are attached to opposing sides of the interposer 1304; in other embodiments, the IC package 1320 and the circuit board 1302 may be attached to a same side of the interposer 1304. In some embodiments, three or more components may be interconnected by way of the interposer 1304.

The interposer 1304 may be formed of an epoxy resin, a fiberglass-reinforced epoxy resin, a ceramic material, or a polymer material such as polyimide. In some implementations, the interposer 1304 may be formed of alternate rigid or flexible materials that may include the same materials described above for use in a semiconductor substrate, such as silicon, germanium, and other group III-V and group IV materials. The interposer 1304 may include metal interconnects 1308 and vias 1310, including but not limited to TSVs 1306. The interposer 1304 may further include embedded devices 1314, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency (RF) devices, power amplifiers, power management devices, antennas, arrays, sensors, and microelectromechanical systems (MEMS) devices may also be formed on the interposer 1304. The interposer 1304 may further include one or more decoupling capacitors based on dummy TSV plates, as described herein. The package-on-interposer structure 1336 may take the form of any of the package-on-interposer structures known in the art.

The IC device assembly 1300 may include an IC package 1324 coupled to the first face 1340 of the circuit board 1302 by coupling components 1322. The coupling components 1322 may take the form of any of the embodiments discussed above with reference to the coupling components 1316, and the IC package 1324 may take the form of any of the embodiments discussed above with reference to the IC package 1320.

The IC device assembly 1300 illustrated in FIG. 5 includes a package-on-package structure 1334 coupled to the second face 1342 of the circuit board 1302 by coupling components 1328. The package-on-package structure 1334 may include an IC package 1326 and an IC package 1332 coupled together by coupling components 1330 such that the IC package 1326 is disposed between the circuit board 1302 and the IC package 1332. The coupling components 1328 and 1330 may take the form of any of the embodiments of the coupling components 1316 discussed above, and the IC packages 1326 and 1332 may take the form of any of the embodiments of the IC package 1320 discussed above. The package-on-package structure 1334 may be configured in accordance with any of the package-on-package structures known in the art.

Figure 6:
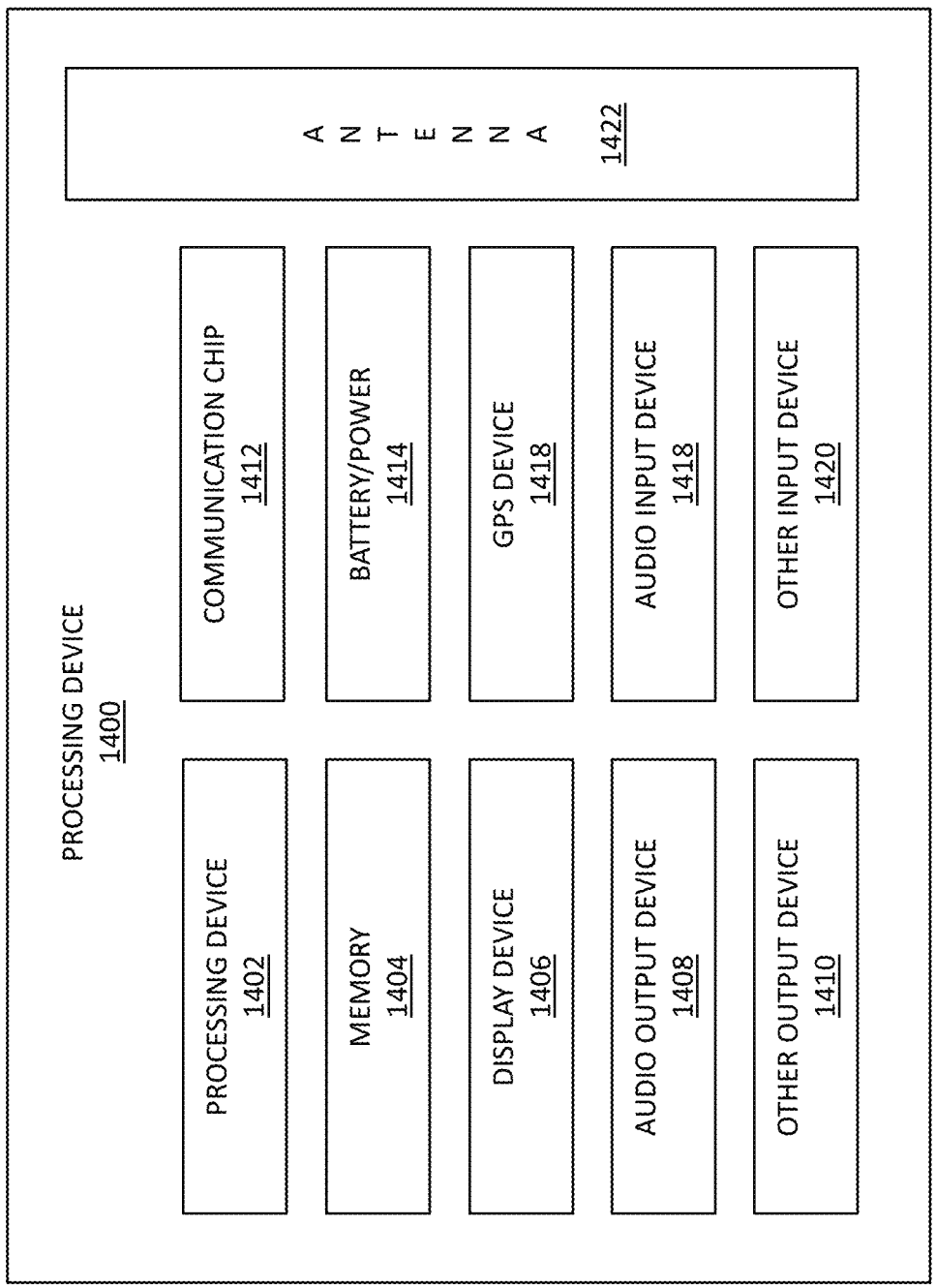
FIG. 6 is a block diagram of an example computing device that may include one or more IC structures with decoupling capacitors based on dummy TSV plates in accordance with any of the embodiments disclosed herein.

FIG. 6 is a block diagram of an example computing device 1400 that may include one or more components including one or more IC structures with one or more decoupling capacitors based on dummy TSV plates in accordance with any of the embodiments disclosed herein. For example, any suitable ones of the components of the computing device 1400 may include a die (e.g., the die 1102 of FIG. 3B) having one or more decoupling capacitors based on dummy TSV plates as described herein. Any one or more of the components of the computing device 1400 may include, or be included in, an IC device 1200 (FIG. 4). Any one or more of the components of the computing device 1400 may include, or be included in, an IC device assembly 1300 (FIG. 5).

A number of components are illustrated in FIG. 6 as included in the computing device 1400, but any one or more of these components may be omitted or duplicated, as suitable for the application. In some embodiments, some or all of the components included in the computing device 1400 may be attached to one or more motherboards. In some embodiments, some or all of these components are fabricated onto a single system-on-a-chip (SoC) die.

Additionally, in various embodiments, the computing device 1400 may not include one or more of the components illustrated in FIG. 6, but the computing device 1400 may include interface circuitry for coupling to the one or more components. For example, the computing device 1400 may not include a display device 1406, but may include display device interface circuitry (e.g., a connector and driver circuitry) to which a display device 1406 may be coupled. In another set of examples, the computing device 1400 may not include an audio input device 1424 or an audio output device 1408 but may include audio input or output device interface circuitry (e.g., connectors and supporting circuitry) to which an audio input device 1424 or audio output device 1408 may be coupled.

The computing device 1400 may include a processing device 1402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 1400 may include a memory 1404, which may itself include one or more memory devices such as volatile memory (e.g., dynamic random-access memory (DRAM)), nonvolatile memory (e.g., read-only memory (ROM)), flash memory, solid state memory, and/or a hard drive. In some embodiments, the memory 1404 may include memory that shares a die with the processing device 1402. This memory may be used as cache memory and may include embedded dynamic random-access memory (eDRAM) or spin transfer torque magnetic random-access memory (STT-MRAM).

In some embodiments, the computing device 1400 may include a communication chip 1412 (e.g., one or more communication chips). For example, the communication chip 1412 may be configured for managing wireless communications for the transfer of data to and from the computing device 1400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1412 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 1412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1412 may operate in accordance with other wireless protocols in other embodiments. The computing device 1400 may include an antenna 1422 to facilitate wireless communications and/or to receive other wireless communications (such as AM or FM radio transmissions).

In some embodiments, the communication chip 1412 may manage wired communications, such as electrical, optical, or any other suitable communication protocols (e.g., the Ethernet). As noted above, the communication chip 1412 may include multiple communication chips. For instance, a first communication chip 1412 may be dedicated to shorter-range wireless communications such as Wi-Fi or Bluetooth, and a second communication chip 1412 may be dedicated to longer-range wireless communications such as GPS, EDGE, GPRS, CDMA, WiMAX, LTE, EV-DO, or others. In some embodiments, a first communication chip 1412 may be dedicated to wireless communications, and a second communication chip 1412 may be dedicated to wired communications.

The computing device 1400 may include battery/power circuitry 1414. The battery/power circuitry 1414 may include one or more energy storage devices (e.g., batteries or capacitors) and/or circuitry for coupling components of the computing device 1400 to an energy source separate from the computing device 1400 (e.g., AC line power).

The computing device 1400 may include a display device 1406 (or corresponding interface circuitry, as discussed above). The display device 1406 may include any visual indicators, such as a heads-up display, a computer monitor, a projector, a touchscreen display, a liquid crystal display (LCD), a light-emitting diode display, or a flat panel display, for example.

The computing device 1400 may include an audio output device 1408 (or corresponding interface circuitry, as discussed above). The audio output device 1408 may include any device that generates an audible indicator, such as speakers, headsets, or earbuds, for example.

The computing device 1400 may include an audio input device 1424 (or corresponding interface circuitry, as discussed above). The audio input device 1424 may include any device that generates a signal representative of a sound, such as microphones, microphone arrays, or digital instruments (e.g., instruments having a musical instrument digital interface (MIDI) output).

The computing device 1400 may include a global positioning system (GPS) device 1418 (or corresponding interface circuitry, as discussed above). The GPS device 1418 may be in communication with a satellite-based system and may receive a location of the computing device 1400, as known in the art.

The computing device 1400 may include an other output device 1410 (or corresponding interface circuitry, as discussed above). Examples of the other output device 1410 may include an audio codec, a video codec, a printer, a wired or wireless transmitter for providing information to other devices, or an additional storage device.

The computing device 1400 may include an other input device 1420 (or corresponding interface circuitry, as discussed above). Examples of the other input device 1420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 1400 may have any desired form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 1400 may be any other electronic device that processes data.

SELECT EXAMPLES

The following paragraphs provide various examples of the embodiments disclosed herein. Example 1 provides an IC structure that includes a support structure (e.g., a substrate), having a first side and a second side, opposite the first side; a TSV, extending between the first side and the second side; and a decoupling capacitor (C1) having a first capacitor plate ($E1_{C1}$), a second capacitor plate ($E2_{C1}$), and a capacitor insulator (silicon has dielectric constant of ~12, would contribute to capacitance) between the first capacitor plate and the second capacitor plate. In such an IC structure, the first capacitor plate is a first opening in the support structure, the first opening at least partially filled with a first electrically conductive material, while the second capacitor plate is a second opening in the support structure, the second opening at least partially filled with a second electrically conductive material (which may be the same as or different from the first electrically conductive material). Each of the first opening and the second opening extends from the second side towards, but not reaching, the first side of the support structure. Each of the first opening and the second opening has a width, a length, and a depth such that the width is at least about 2 times smaller than each of the length and the depth, the width is a dimension of the first or second opening in a direction of an x-axis of an x-y-z coordinate system, the length is a dimension of the first or second opening in a direction of a y-axis of the x-y-z coordinate system, and the depth is a dimension of the first or second opening in a direction of a z-axis of the x-y-z coordinate system, each of the x, y, and z-axis being perpendicular to the other two of the axis.

Example 2 provides the IC structure according to example 1, where the capacitor insulator includes a portion of the support structure between the first capacitor plate and the second capacitor plate.

Example 3 provides the IC structure according to examples 1 or 2, where at least one of the first opening and the second opening includes a liner of an insulator material (e.g., material 204 shown in the present drawings) on sidewalls and a bottom of the opening.

Example 4 provides the IC structure according to example 3, where the capacitor insulator includes at least a portion of the liner of the insulator material.

Example 5 provides the IC structure according to examples 3 or 4, where a thickness of the liner of the insulator material is between about 1 and 7 nanometers.

Example 6 provides the IC structure according to any one of examples 3-5, further including a liner of the insulator material on sidewalls and a bottom of the TSV.

Example 7 provides the IC structure according to any one of examples 3-6, where the insulator material is silicon oxide or silicon nitride.

Example 8 provides the IC structure according to any one of the preceding examples, where at least one of the first opening and the second opening includes a liner of a barrier material on sidewalls and a bottom of the opening.

Example 9 provides the IC structure according to any one of the preceding examples, where, at least for one of the first opening and the second opening, the depth is between about 1 and 25 micrometers.

Example 10 provides the IC structure according to any one of the preceding examples, where, at least for one of the first opening and the second opening, the depth is between about 1.1 and 4 times smaller than a distance between the first side and the second side of the support structure.

Example 11 provides the IC structure according to any one of the preceding examples, where, at least for one of the first opening and the second opening, the width is between about 250 and 5000 nanometers.

Example 12 provides the IC structure according to any one of the preceding examples, where the width of each of the first opening and the second opening is smaller than a width of the TSV (i.e., a dimension of the TSV in an x-y plane, e.g., in a direction of an x-axis, of the x-y-z coordinate system shown in the present drawings), e.g., at least 2 times smaller or at least 4 times smaller.

Example 13 provides the IC structure according to any one of the preceding examples, where the first capacitor plate is coupled to a positive supply voltage and the second capacitor plate is coupled to a negative supply voltage or a ground voltage.

Example 14 provides the IC structure according to any one of the preceding examples, where the decoupling capacitor is a first decoupling capacitor (C1), the IC structure further includes a second decoupling capacitor (C2) having a first capacitor plate, a second capacitor plate, and a capacitor insulator between the first capacitor plate and the second capacitor plate, the second capacitor plate of the second decoupling capacitor ($E2_{C2}$) is the second capacitor plate of the first decoupling capacitor ($E2_{C1}$), the first capacitor plate of the second decoupling capacitor ($E1_{C2}$) is a third opening in the support structure, the third opening at least partially filled with a third electrically conductive material (which may be the same as or different from the first and second electrically conductive materials), the second opening is between the first opening and the third opening, and the third opening extends from the second side towards, but not reaching, the first side of the support structure. The third opening has a width, a length, and a depth such that the width is at least about 2 times smaller than each of the length and the depth, the width is a dimension of the opening in a direction of an x-axis of an x-y-z coordinate system, the length is a dimension of the opening in a direction of a y-axis of the x-y-z coordinate system, and the depth is a dimension of the opening in a direction of a z-axis of the x-y-z coordinate system, each of the x, y, and z-axis being perpendicular to the other two of the axis.

Example 15 provides the IC structure according to example 14, where the IC structure further includes a third decoupling capacitor (C3) and a fourth decoupling capacitor (C4), each having a first capacitor plate, a second capacitor plate, and a capacitor insulator between the first capacitor plate and the second capacitor plate. The first capacitor plate of the third decoupling capacitor ($E1_{C3}$) is the first capacitor plate of the second decoupling capacitor ($E1_{C2}$). The second capacitor plate of the third decoupling capacitor ($E2_{C3}$) is the second capacitor plate of the fourth decoupling capacitor ($E2_{C4}$). The second capacitor plate of the fourth decoupling capacitor ($E2_{C4}$) is a fourth opening in the support structure, the fourth opening at least partially filled with a fourth electrically conductive material (which may be the same as or different from any of the first, second, and third electrically conductive materials). The first capacitor plate of the fourth decoupling capacitor ($E1_{C4}$) is a fifth opening in the support structure, the fifth opening at least partially filled with a fifth electrically conductive material (which may be the same as or different from any of the first, second, third, and fourth electrically conductive materials). The fourth opening is between the third opening and the fifth opening. Each of the fourth opening and the fifth opening extends from the second side towards, but not reaching, the first side of the support structure, and each of the fourth opening and the fifth opening has a width, a length, and a depth such that the width is at least about 2 times smaller than each of the length and the depth, the width is a dimension of the opening in a direction of an x-axis of an x-y-z coordinate system, the length is a dimension of the opening in a direction of a y-axis of the x-y-z coordinate system, and the depth is a dimension of the opening in a direction of a z-axis of the x-y-z coordinate system, each of the x, y, and z-axis being perpendicular to the other two of the axis.

Example 16 provides the IC structure according to example 15, where, for each of the first decoupling capacitor, the second decoupling capacitor, the third decoupling capacitor, and the fourth decoupling capacitor, the first capacitor plate is coupled to a positive supply voltage and the second capacitor plate is coupled to a negative supply voltage or a ground voltage.

Example 17 provides an IC package that includes an IC die having a first side and a second side, opposite the first side; and a further IC component, coupled to the IC die. The IC die has a first side and a second side, opposite the first side, the IC die includes a decoupling capacitor (C1) having a first capacitor plate ($E1_{C1}$), a second capacitor plate ($E2_{C1}$), and a capacitor insulator between the first capacitor plate and the second capacitor plate, the first capacitor plate is a first opening in the support structure, the first opening at least partially filled with a first electrically conductive material, and the second capacitor plate is a second opening in the support structure, the second opening at least partially filled with a second electrically conductive material (which may be the same as or different from the first electrically conductive material). Furthermore, each of the first opening and the second opening extends from the second side towards, but not reaching, the first side of the support structure, each of the first opening and the second opening has a width, a length, and a depth such that the width is at least about 2 times smaller than each of the length and the depth, the width is a dimension of the first or second opening in a direction of an x-axis of an x-y-z coordinate system, the length is a dimension of the first or second opening in a direction of a y-axis of the x-y-z coordinate system, and the depth is a dimension of the first or second opening in a direction of a z-axis of the x-y-z coordinate system, each of the x, y, and z-axis being perpendicular to the other two of the axis.

Example 18 provides the IC package according to example 17, where the IC die further includes a TSV extends between the first side and the second side of the IC die.

Example 19 provides the IC package according to examples 17 or 18, where, for each of the first opening and the second opening, the depth is between about 1.1 and 4 times smaller than a distance between the first side and the second side of the IC die.

Example 20 provides the IC package according to any one of examples 17-19, where the further component is one of a package substrate, a flexible substrate, or an interposer.

Example 21 provides the IC package according to any one of examples 17-20, where the further component is coupled to the IC die via one or more first level interconnects.

Example 22 provides the IC package according to example 21, where the one or more first level interconnects include one or more solder bumps, solder posts, or bond wires.

Example 23 provides a method for fabricating an IC structure. The method includes providing, in a support structure, an opening for a through-silicon via (TSV), and a first and a second openings for a decoupling capacitor, where each of the first opening and the second opening is a blind opening in the support structure, each of the first opening and the second opening has a width, a length, and a depth such that the width is at least about 2 times smaller than each of the length and the depth, the width is a dimension of the first or second opening in a direction of an x-axis of an x-y-z coordinate system, the length is a dimension of the first or second opening in a direction of a y-axis of the x-y-z coordinate system, and the depth is a dimension of the first or second opening in a direction of a z-axis of the x-y-z coordinate system, each of the x, y, and z-axis being perpendicular to the other two of the axis, and the depth of the first and second openings for the decoupling capacitor is between about 1.1 and 4 times smaller than a depth of the opening for the TSV. The method also includes providing a first capacitor plate of the decoupling capacitor by at least partially filling the first opening with a first electrically conductive material; and providing a second capacitor plate of the decoupling capacitor by at least partially filling the second opening with a second electrically conductive material (which may be the same as or different from the first electrically conductive material).

Example 24 provides the method according to example 23, further including providing a liner of an insulator material (e.g., material 204 shown in the present drawings) on sidewalls and a bottom of at least one of the first opening and the second opening before providing the first capacitor plate and the second capacitor plate.

Example 25 provides the method according to examples 23 or 24, further including processes for fabricating the IC structure according to any one of the preceding examples (e.g., the IC structure according to any one of examples 1-16) and/or processes for fabricating the IC package according to any one of the preceding examples (e.g., the IC package according to any one of examples 17-22).

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) structure, comprising:
a support having a first side and a second side, opposite the first side;
a via extending between the first side and the second side of the support, wherein the via has a first end and a second end, the second end is opposite the first end, a conductive material of the via at the first end is at the first side of the support, and the conductive material of the via at the second end is at the second side of the support; and
a capacitor having a first capacitor plate, a second capacitor plate, and a capacitor insulator between the first capacitor plate and the second capacitor plate,
wherein:
the first capacitor plate and the second capacitor plate are opposing plates of the capacitor,
the first capacitor plate includes a first structure of a first conductive material, the first structure extending from the second side towards the first side of the support,
the second capacitor plate includes a second structure of a second conductive material, the second structure extending from the second side towards the first side of the support,
the first capacitor plate and the second capacitor plate are substantially parallel to one another,
the conductive material of the via is electrically isolated from the first capacitor plate and from the second capacitor plate, and
a width of the via is greater than a width of the first capacitor plate and a width of the second capacitor plate.

2. The IC structure according to claim 1, wherein the capacitor insulator includes a portion of the support between the first capacitor plate and the second capacitor plate.

3. The IC structure according to claim 1, wherein the first capacitor plate includes a liner of an insulator material on sidewalls and a bottom of the first structure of the first conductive material.

4. The IC structure according to claim 3, wherein the insulator material includes silicon and oxygen or nitrogen.

5. The IC structure according to claim 1, wherein the first capacitor plate includes a liner of a barrier material on sidewalls and a bottom of the first structure of the first conductive material.

6. The IC structure according to claim 1, wherein, the first structure of the first conductive material extends from the second side towards the first side of the support by a depth between about 1 micrometer and 25 micrometers.

7. The IC structure according to claim 1, wherein the first structure of the first conductive material extends from the second side towards the first side of the support by a depth, and the depth is between about 1.1 and 4 times smaller than a distance between the first side and the second side.

8. The IC structure according to claim 1, further comprising:
a first contact to couple the first capacitor plate to a first voltage; and
a second contact to couple the second capacitor plate to a second voltage.

9. The IC structure according to claim 1, wherein:
the capacitor is a first capacitor,
the IC structure further includes a second capacitor having a first capacitor plate, a second capacitor plate, and a capacitor insulator between the first capacitor plate and the second capacitor plate,
the second capacitor plate of the second capacitor is the second capacitor plate of the first capacitor,
the first capacitor plate of the second capacitor is a third structure of a third conductive material, the third structure extending from the second side towards, but not reaching, the first side of the support,
the second capacitor plate is between the first capacitor plate and the third structure,
the third structure and the second structure are substantially parallel to one another, and
the conductive material of the via is electrically isolated from the first capacitor plate of the second capacitor.

10. The IC structure according to claim 9, wherein:
the IC structure further includes a third capacitor and a fourth capacitor, each having a first capacitor plate, a second capacitor plate, and a capacitor insulator between the first capacitor plate and the second capacitor plate,
the first capacitor plate of the third capacitor is the first capacitor plate of the second capacitor,
the second capacitor plate of the third capacitor is the second capacitor plate of the fourth capacitor,
the second capacitor plate of the fourth capacitor is a fourth structure of a fourth conductive material, the fourth structure extending from the second side towards, but not reaching, the first side of the support,
the first capacitor plate of the fourth capacitor is a fifth structure of a fifth conductive material, the fifth structure extending from the second side towards, but not reaching, the first side of the support,
the fourth structure is between the third structure and the fifth structure, and
the third structure, the fourth structure, and the fifth structure are substantially parallel to one another.

11. The IC structure according to claim 10, wherein the conductive material of the via is electrically isolated from the fourth structure and the fifth structure.

12. The IC structure according to claim 1, wherein:
each of the first structure and the second structure has a width, a length, and a depth such that the width is at least about 2 times smaller than each of the length and the depth.

13. The IC structure according to claim 1, wherein the first structure and the second structure do not reach the first side of the support.

14. The IC structure according to claim 1, wherein the first structure and the second structure are planar structures.

15. The IC structure according to claim 1, wherein the first capacitor plate includes a liner of an insulator material on sidewalls and a bottom of the first structure of the first conductive material, and wherein the capacitor insulator includes at least a portion of the liner of the insulator material.

16. An integrated circuit (IC) package, comprising:
an IC die; and
an IC component, coupled to the IC die,
wherein:
the IC die has a first side and a second side, opposite the first side,
the IC die includes a through via that extends between the first side of the IC die and the second side of the IC die and has a first end at the first side of the IC die and a second end at the second side of the IC die,
the IC die further includes a capacitor having a first capacitor plate, a second capacitor plate, and a capacitor insulator between the first capacitor plate and the second capacitor plate,
the first capacitor plate includes a first planar structure of a first conductive material, the first planar structure extending from the second side towards, but not reaching, the first side of the IC die,
the second capacitor plate includes a second planar structure of a second conductive material, the second planar structure extending from the second side towards, but not reaching, the first side of the IC die,
the first capacitor plate and the second capacitor plate are substantially parallel to one another,
a conductive material of the through via is electrically isolated from the first capacitor plate and from the second capacitor plate, and
a width of the through via is greater than a width of the first capacitor plate and a width of the second capacitor plate.

17. The IC package according to claim 16, wherein the width of the through via is between 1.5 and 10 times greater than the width of the first capacitor plate and the width of the second capacitor plate.

18. The IC package according to claim 16, wherein:
the first planar structure and the second planar structure extend from the second side towards, but not reaching, the first side of the IC die, and
each of the first planar structure and the second planar structure has a width, a length, and a depth such that the width is at least about 2 times smaller than each of the length and the depth.

19. The IC package according to claim 16, wherein the IC component is one of another IC die, a package substrate, a circuit board, or an interposer.

20. A method for fabricating an integrated circuit (IC) structure, the method comprising:
providing a via extending from a first side to a second side of a support, wherein the second side is opposite the first side, the via has a first end and a second end, the second end is opposite the first end, a conductive material of the via at the first end is at the first side of the support, and the conductive material of the via at the second end is at the second side of the support; and
providing a capacitor having a first capacitor plate, a second capacitor plate, and a capacitor insulator between the first capacitor plate and the second capacitor plate,
wherein:
the first capacitor plate and the second capacitor plate are opposing plates of the capacitor,
the first capacitor plate includes a first structure of a first conductive material, the first structure extending from the second side towards the first side of the support,
the second capacitor plate includes a second structure of a second conductive material, the second structure extending from the second side towards the first side of the support,
the first capacitor plate and the second capacitor plate are substantially parallel to one another,
the conductive material of the via is electrically isolated from the first capacitor plate and from the second capacitor plate, and
a width of the via is greater than a width of the first capacitor plate and a width of the second capacitor plate.

21. The method according to claim 19, wherein:
each of the first structure and the second structure has a width, a length, and a depth such that the width is at least about 2 times smaller than each of the length and the depth, and
the first structure extends from the second side towards the first side of the support by a distance that is between about 1.1 and 4 times smaller than a distance between the first side and the second side.

* * * * *

UNITED STATES PATENT AND TRADEMARK OFFICE
CERTIFICATE OF CORRECTION

PATENT NO. : 12,402,331 B2
APPLICATION NO. : 17/170951
DATED : August 26, 2025
INVENTOR(S) : Park Page 1 of 1

It is certified that error appears in the above-identified patent and that said Letters Patent is hereby corrected as shown below:

In the Claims

In Column 24, Claim 6, Line 12, delete "wherein," and insert -- wherein --, therefor.

In Column 26, Claim 21, Line 44, delete "claim 19," and insert -- claim 20, --, therefor.

Signed and Sealed this
Thirtieth Day of September, 2025

John A. Squires
*Director of the United States Patent and Trademark Office*